United States Patent
Moon et al.

(10) Patent No.: US 11,145,846 B2
(45) Date of Patent: Oct. 12, 2021

(54) APPARATUS AND METHOD FOR MANUFACTURING DISPLAY DEVICE

(71) Applicant: Samsung Display Co., Ltd., Yongin-si (KR)

(72) Inventors: Seung Jun Moon, Yongin-si (KR); Byung Hoon Kang, Yongin-si (KR); Dong Kyun Seo, Yongin-si (KR); Hee Kyun Shin, Yongin-si (KR); Jun Ho Sim, Yongin-si (KR); Woo Jin Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 67 days.

(21) Appl. No.: 16/798,924

(22) Filed: Feb. 24, 2020

(65) Prior Publication Data

US 2020/0321563 A1   Oct. 8, 2020

(30) Foreign Application Priority Data

Apr. 2, 2019  (KR) .................. 10-2019-0038620

(51) Int. Cl.
*H01L 51/56*    (2006.01)
*H01L 27/32*    (2006.01)
*H01L 51/00*    (2006.01)

(52) U.S. Cl.
CPC .......... *H01L 51/56* (2013.01); *H01L 27/3244* (2013.01); *H01L 51/0097* (2013.01); *H01L 2227/323* (2013.01); *H01L 2227/326* (2013.01)

(58) Field of Classification Search
None
See application file for complete search history.

(56) References Cited

U.S. PATENT DOCUMENTS

| 9,184,180 | B2 | 11/2015 | Huh et al. | |
| 9,735,379 | B2* | 8/2017 | Joo | .......... C25D 5/08 |
| 2014/0242354 | A1* | 8/2014 | Ro | .......... H01L 51/448 |
| | | | | 428/195.1 |
| 2015/0021631 | A1* | 1/2015 | Huh | .......... H01L 29/78684 |
| | | | | 257/88 |
| 2015/0060870 | A1* | 3/2015 | Ro | .......... H01L 27/1218 |
| | | | | 257/72 |

FOREIGN PATENT DOCUMENTS

| KR | 10-2015-0009289 | 1/2015 |
| KR | 10-2016-0087971 | 7/2016 |

* cited by examiner

*Primary Examiner* — J. E. Schoenholtz
(74) *Attorney, Agent, or Firm* — Lewis Roca Rothgerber Christie LLP

(57) ABSTRACT

An apparatus and a method for manufacturing a display device are provided. An apparatus for manufacturing a display device includes a first unit configured to remove impurities of a support substrate, a second unit configured to form a sacrificial layer on the support substrate, a third unit configured to form a flexible substrate on the sacrificial layer, and a fourth unit configured to form a display unit on the flexible substrate. The second unit includes a moving unit movable in a first direction to receive the support substrate, a first supply nozzle configured to spray a solution onto the support substrate to coat a graphene oxide layer, and a second supply nozzle configured to dry the graphene oxide layer coated on the support substrate while removing a portion of the graphene oxide layer, to form the sacrificial layer.

20 Claims, 22 Drawing Sheets

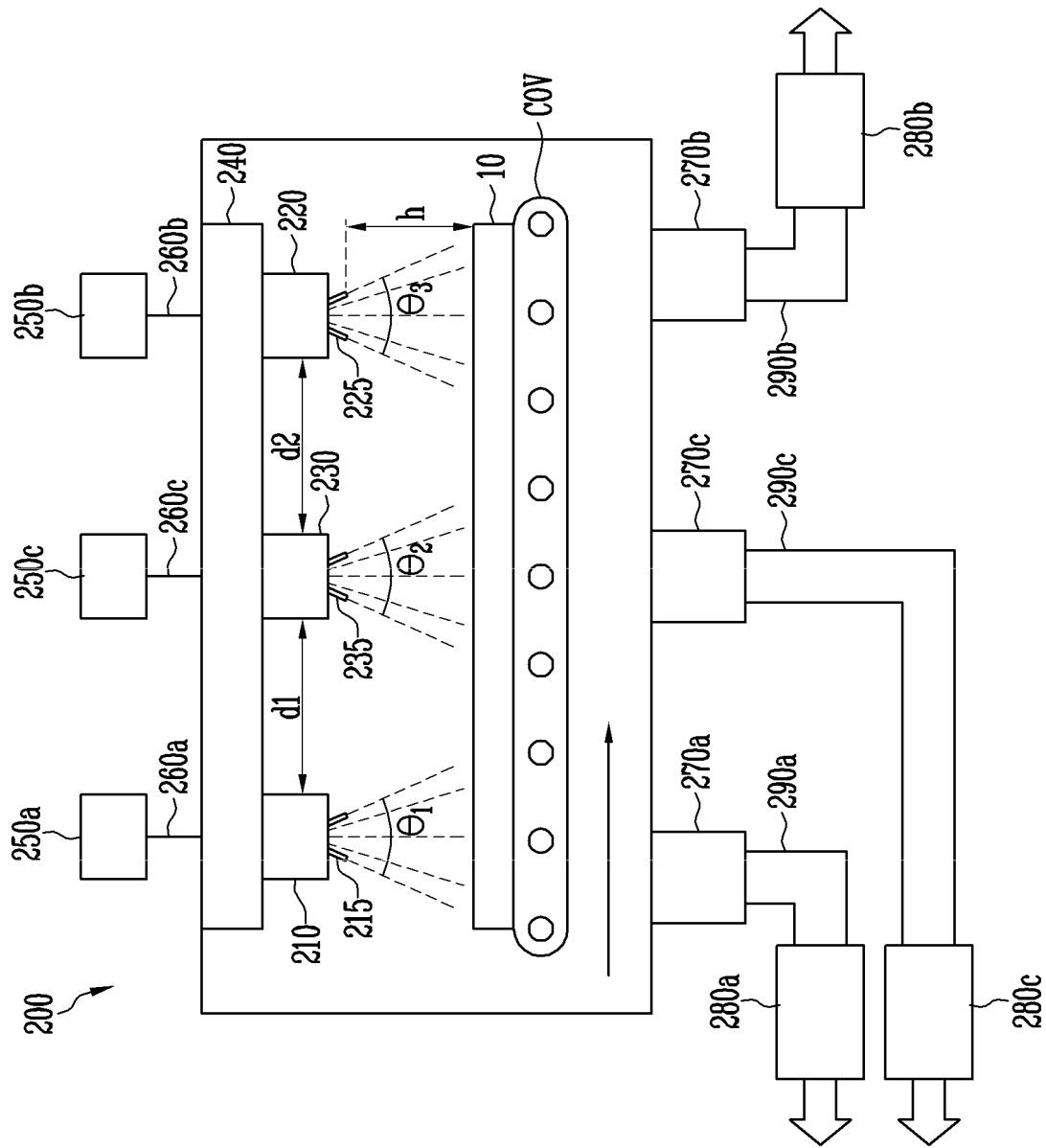

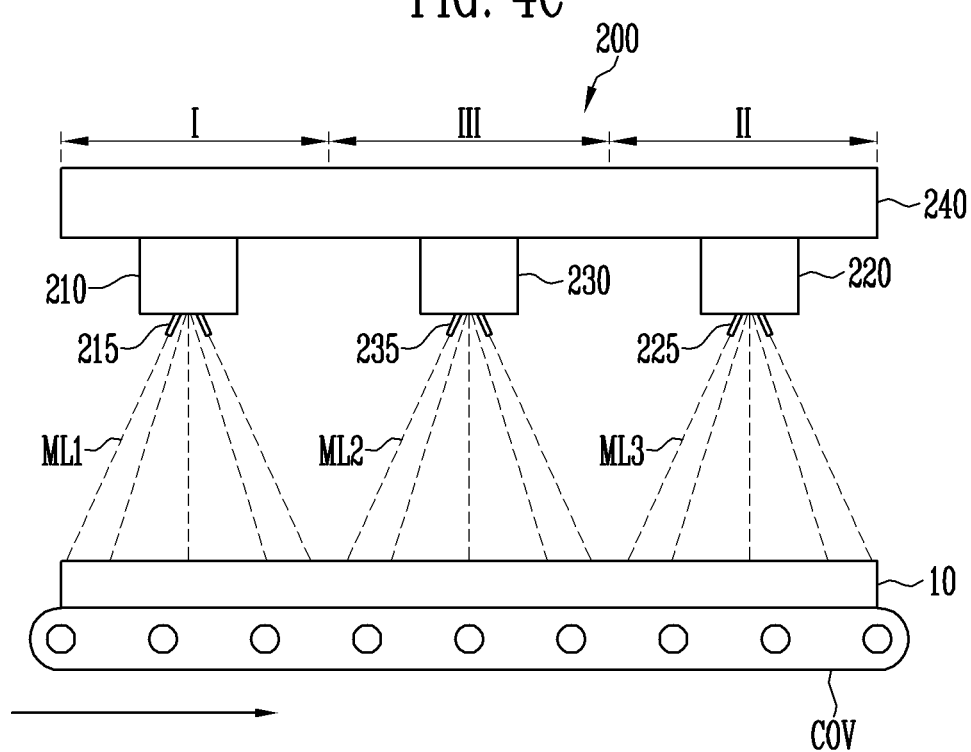

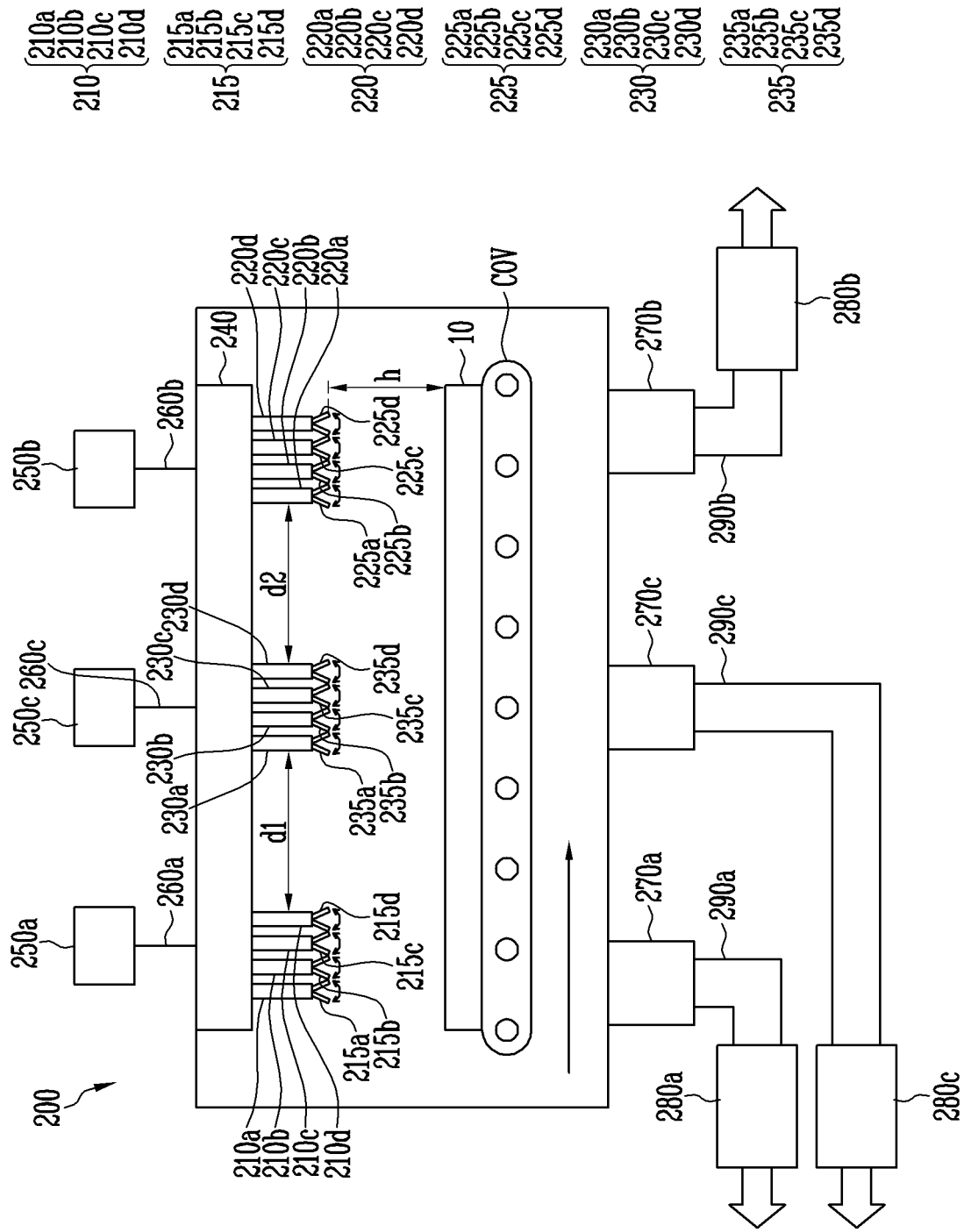

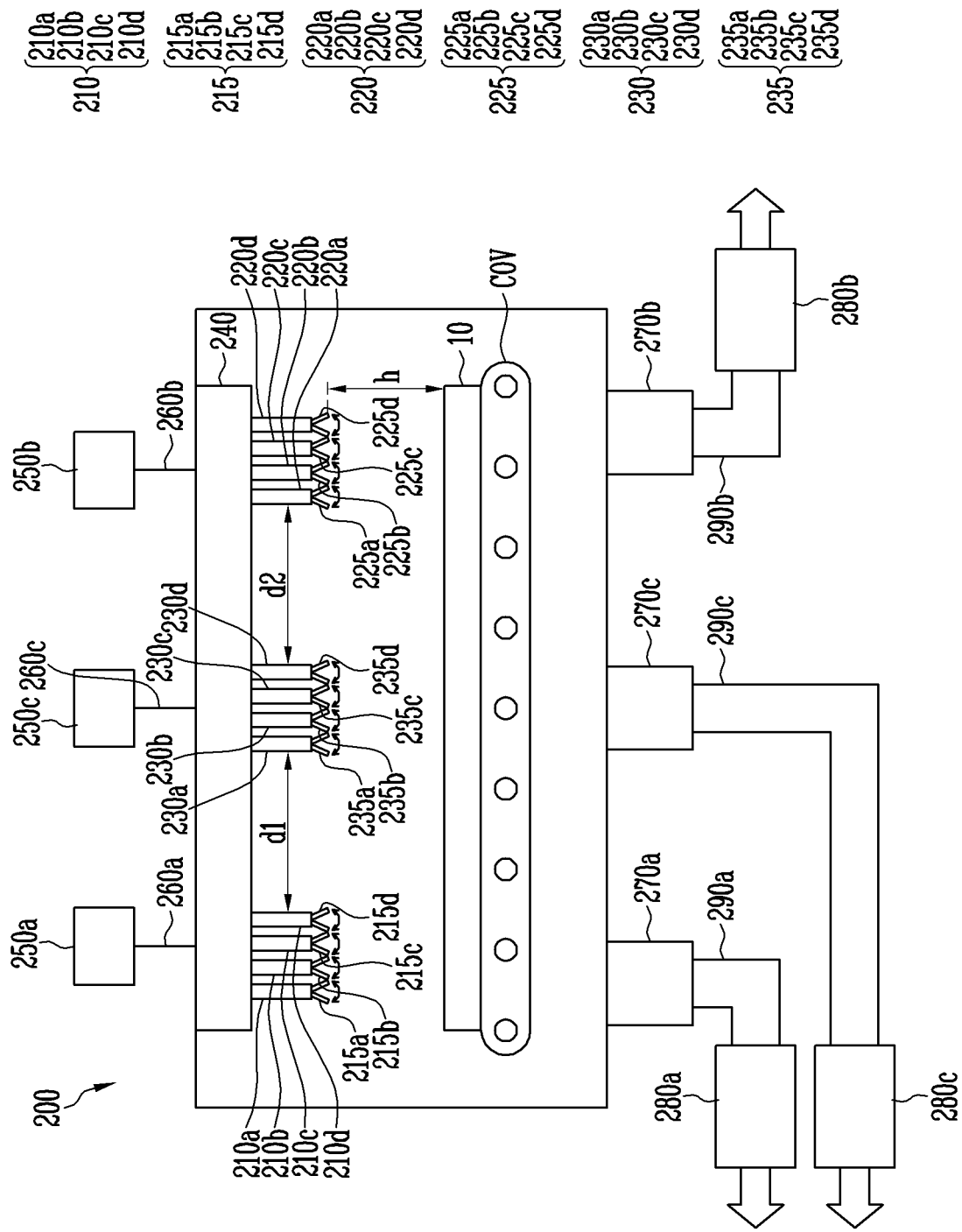

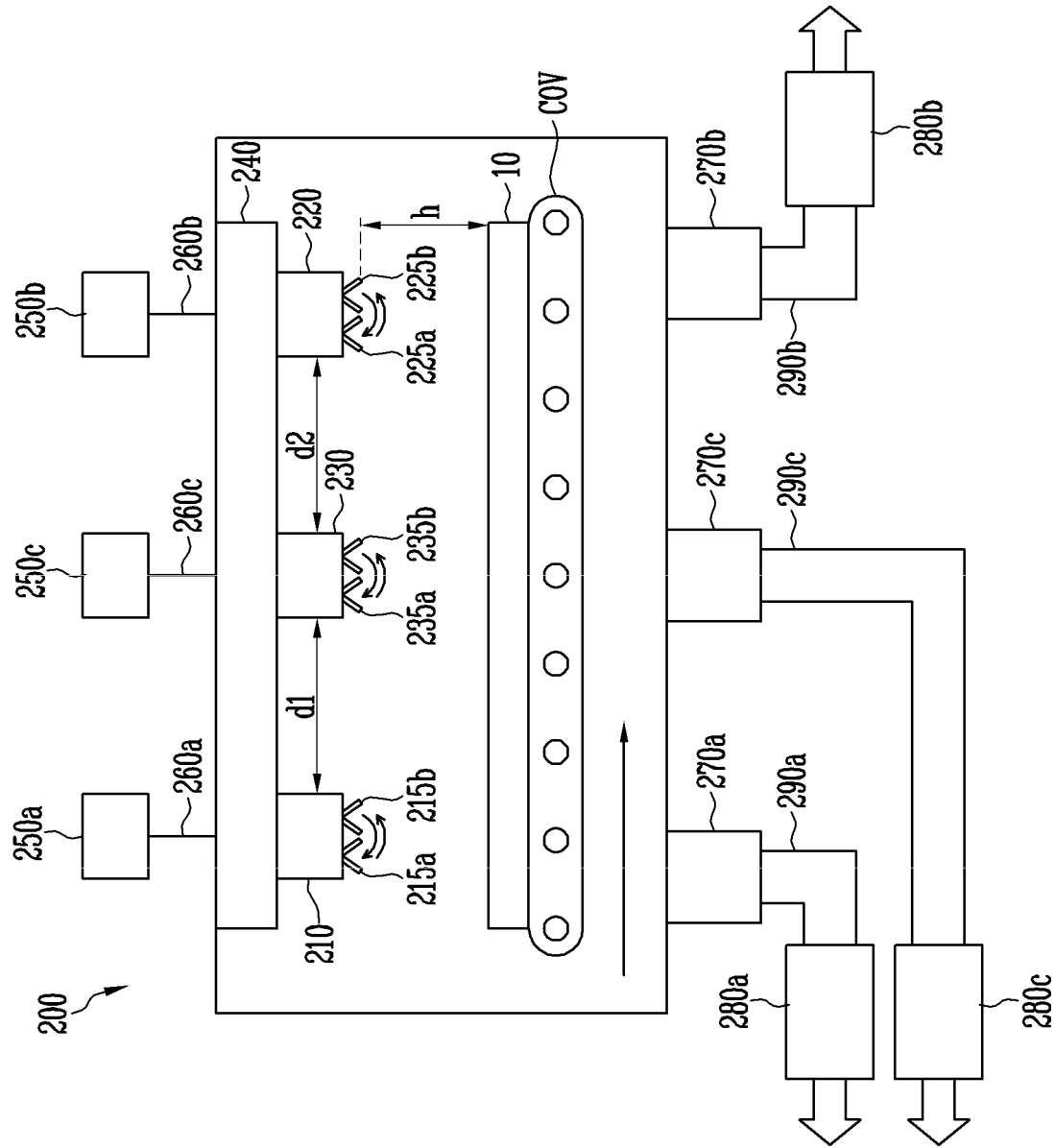

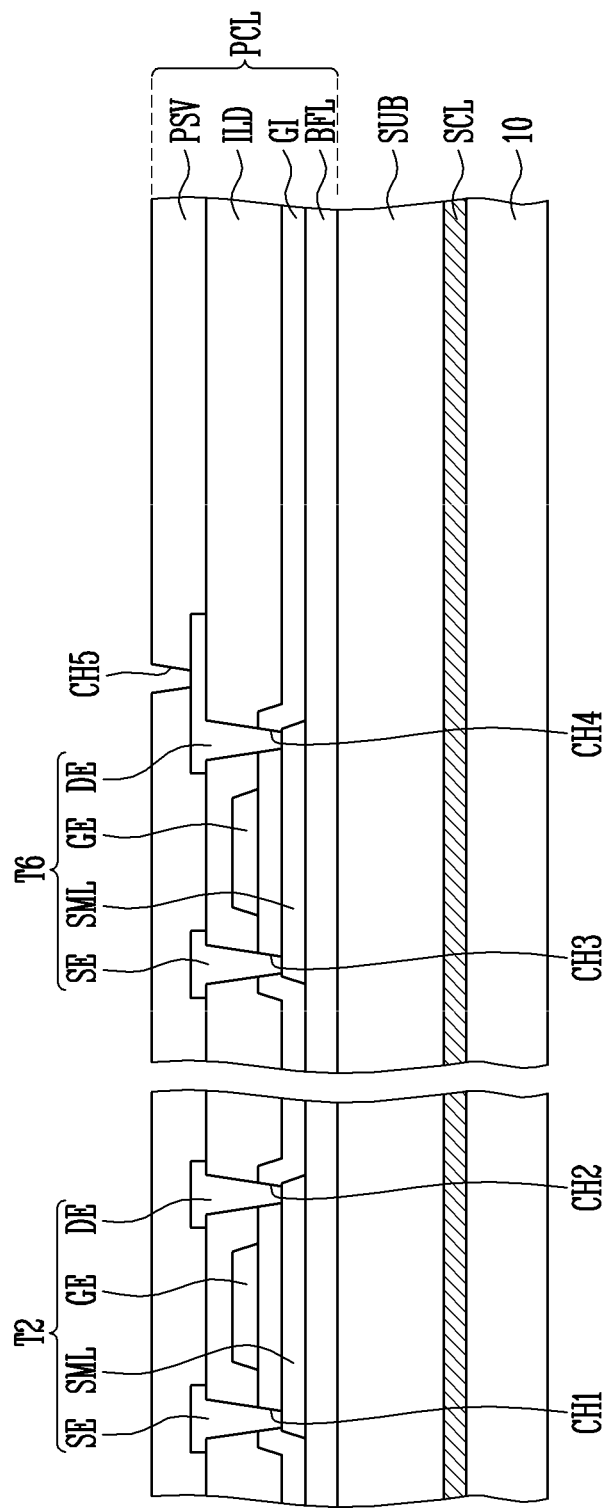

APPARATUS AND METHOD FOR MANUFACTURING DISPLAY DEVICE

CROSS-REFERENCE TO RELATED APPLICATION

The present application claims priority to and the benefit of Korean Patent Application No. 10-2019-0038620, filed on Apr. 2, 2019 in the Korean Intellectual Property Office, the entire disclosure of which is incorporated herein by reference.

BACKGROUND

1. Field

Aspects of embodiments of the present disclosure relate to an apparatus for manufacturing a display device and a method of manufacturing the same.

2. Description of Related Art

Electronic devices based on mobility are widely used. Recently, tablet PCs as well as small electronic devices, such as mobile phones, are widely used as mobile electronic devices.

The mobile electronic devices may include a display unit to provide visual information, such as an image or a picture, to a user, for the purpose of supporting various functions. In recent years, as the size of other components for driving the display unit is reduced, the proportion of the display unit occupied in the electronic device is gradually increasing. The display unit is developed to be bendable at an angle (e.g., a predetermined angle) from a flat state.

SUMMARY

According to an aspect of embodiments of the present disclosure, an apparatus and a method for manufacturing a display device, capable of simplifying a manufacturing process, are provided.

According to one or more embodiments of the present disclosure, an apparatus for manufacturing a display device includes a first unit configured to remove impurities of a support substrate; a second unit configured to form a sacrificial layer on the support substrate; a third unit configured to form a flexible substrate on the sacrificial layer; and a fourth unit configured to form a display unit on the flexible substrate. The second unit may include a moving unit movable in a first direction to receive the support substrate; a first supply nozzle configured to spray a solution, to be bonded to the support substrate by van der Waals bonding, onto the support substrate to coat a graphene oxide layer; and a second supply nozzle configured to dry the graphene oxide layer coated on the support substrate while removing a portion of the graphene oxide layer to form the sacrificial layer. The first supply nozzle and the second supply nozzle may be spaced apart from each other by a distance and may be coupled to each other in line. Further, each of the first and second supply nozzles may include an injection port having an injection angle of about 15° to 45°.

In an embodiment, the distance between the first supply nozzle and the second supply nozzle may be about 50 mm.

In an embodiment, the second unit may further include a third supply nozzle between the first supply nozzle and the second supply nozzle.

In an embodiment, the third supply nozzle may be configured to spray deionized (DI) water onto the graphene oxide layer of the support substrate moving in the first direction to clean the graphene oxide layer of the support substrate.

In an embodiment, the third supply nozzle may be spaced apart from each of the first and second supply nozzles by a distance and may be coupled to the first and second supply nozzles in line.

In an embodiment, the third supply nozzle may include an injection port having an injection angle of about 15° to 45°.

In an embodiment, a distance between the first supply nozzle and the third supply nozzle may be equal to a distance between the third supply nozzle and the second supply nozzle.

In an embodiment, the second supply nozzle may include an air knife to spray gas at high pressure.

In an embodiment, each of the first to third supply nozzles may include at least one subsidiary supply nozzle arranged in the first direction.

In an embodiment, the subsidiary supply nozzle of each of the first to third supply nozzles may include an injection port, and the injection port may be repeatedly movable leftwards and rightwards from the first direction to a direction opposite to the first direction.

In an embodiment, the second unit may further include a frame to support each of the first to third supply nozzles, and the frame may be movable in the first direction.

In an embodiment, the second unit may further include a recovery unit to recover the solution sprayed from the first supply nozzle.

In an embodiment, the display unit may include a pixel circuit layer on the flexible substrate and including at least one transistor; and a display element layer on the pixel circuit layer and electrically coupled to the transistor to emit light.

According to one or more embodiments, a method of manufacturing a display device includes preparing a support substrate; forming a sacrificial layer by spraying a solution, which is bonded to the support substrate by van der Waals bonding, onto the support substrate, thus coating a graphene oxide layer, and then drying the graphene oxide layer while removing a portion of the graphene oxide layer; forming a flexible substrate on the sacrificial layer; forming a display unit on the flexible substrate; forming a thin-film encapsulation film on the display unit; and separating the support substrate from the flexible substrate.

In an embodiment, the forming of the sacrificial layer may further include cleaning the graphene oxide layer by spraying deionized (DI) water onto the graphene oxide layer of the support substrate moving in a first direction.

In an embodiment, the forming of the sacrificial layer may include drying the graphene oxide layer while removing a portion of the graphene oxide layer using an air knife configured to spray gas at high pressure.

In an embodiment, the preparing of the support substrate may include removing surface impurities of the support substrate. In an embodiment, the surface impurities of the support substrate may be removed by spraying oxygen plasma onto a surface of the support substrate.

In an embodiment, the forming of the display unit may include forming a pixel circuit layer including at least one transistor on the flexible substrate; and forming a display element layer including a light emitting element on the pixel circuit layer, the light emitting element being electrically coupled to the transistor to emit light.

According to one or more embodiments of the present disclosure, an apparatus for manufacturing a display device includes a first unit configured to remove impurities of a support substrate; a second unit configured to form a sacrificial layer on the support substrate; a third unit configured to form a flexible substrate on the sacrificial layer; and a fourth unit configured to form a display unit on the flexible substrate. The second unit may include a moving unit movable in a first direction to receive the support substrate; a first supply nozzle configured to spray a solution, to be bonded to the support substrate by van der Waals bonding, onto the support substrate, to coat a graphene oxide layer; and a second supply nozzle configured to dry the graphene oxide layer coated on the support substrate while removing a portion of the graphene oxide layer, to form the sacrificial layer. The first supply nozzle and the second supply nozzle may be spaced apart from each other by a distance and may be coupled to each other in line.

BRIEF DESCRIPTION OF THE DRAWINGS

FIG. 2 is a view illustrating a second unit shown in FIG. 1.

FIGS. 4A to 4C are diagrams schematically illustrating a manufacturing process for forming a sacrificial layer on a support substrate in the second unit of FIG. 2.

FIG. 6B is a diagram illustrating the second unit of FIG. 2 in accordance with another embodiment.

FIG. 6C is a diagram illustrating the second unit of FIG. 2 in accordance with another embodiment.

FIG. 6D is a diagram illustrating the second unit of FIG. 2 in accordance with another embodiment.

FIGS. 13A to 13G are cross-sectional views sequentially illustrating the method of manufacturing the display device of FIG. 9 according to the flowchart of FIG. 12.

DETAILED DESCRIPTION

Figure 1:
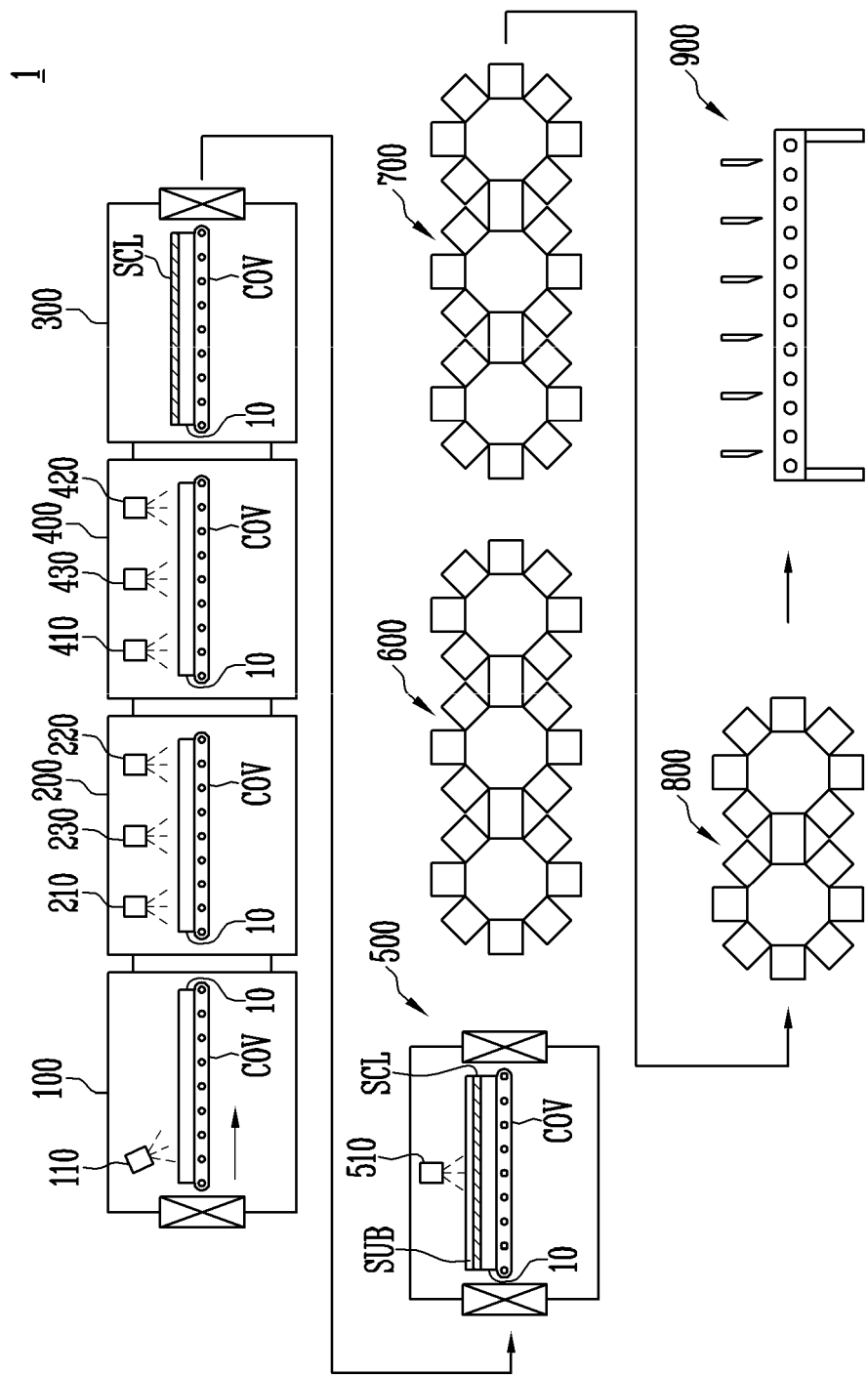
FIG. 1 is a conceptual view schematically illustrating an apparatus for manufacturing a display device in accordance with an embodiment of the present disclosure.

As the present disclosure allows for various changes and numerous embodiments, some particular embodiments will be illustrated in the drawings and described in further detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It is to be understood that, although the terms "first," "second," etc. may be used herein to describe various elements, these elements should not be limited by these terms. These terms are used to distinguish one element from another element. For instance, a first element discussed below could be termed a "second" element without departing from the teachings of the present disclosure. Similarly, the second element could also be termed a "first" element. In the present disclosure, the singular forms are intended to include the plural forms as well, unless the context clearly indicates otherwise.

It is to be further understood that the terms "comprise," "include," "have," etc. when used in this specification, specify the presence of stated features, integers, steps, operations, elements, components, and/or combinations thereof but do not preclude the presence or addition of one or more other features, integers, steps, operations, elements, components, and/or combinations thereof. Further, when a first part such as a layer, a film, a region, or a plate is disposed on a second part, the first part may be not only directly on the second part but one or more third parts may be present therebetween. In addition, when it is expressed that a first part, such as a layer, a film, a region, or a plate is formed on a second part, the surface of the second part on which the first part is formed is not limited to an upper surface of the second part but may include other surfaces, such as a side surface or a lower surface of the second part. Further, when a first part, such as a layer, a film, a region, or a plate is under a second part, the first part may be not only directly under the second part but one or more third parts may be present therebetween.

When a certain embodiment may be implemented differently, a specific process order may be different from a described one. For example, two processes that are consecutively described may be performed substantially at the same time or performed in an order opposite to the described order.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiments of the present disclosure will herein be described in further detail with reference to the accompanying drawings.

FIG. 1 is a conceptual view schematically illustrating an apparatus for manufacturing a display device in accordance with an embodiment of the present disclosure.

Referring to FIG. 1, an apparatus 1 for manufacturing a display device in accordance with an embodiment of the present disclosure may include first to fourth units 100 to 400. Further, the apparatus 1 for manufacturing the display device in accordance with an embodiment of the present disclosure may further include a flexible substrate forming unit 500, a pixel circuit layer forming unit 600, a display element layer forming unit 700, a thin-film encapsulation film forming unit 800, and a cutting unit 900. Respective units may be connected to each other by a separate transfer means (not shown), a connecting means (not shown), or the like.

In an embodiment, the flexible substrate forming unit 500, the pixel circuit layer forming unit 600, the display element layer forming unit 700, the thin-film encapsulation film forming unit 800, and the cutting unit 900 may be sequentially connected to the second unit 200 and/or the fourth unit 400. In another embodiment, they may be sequentially connected to the third unit 300. According to another embodiment, the flexible substrate forming unit 500, the pixel circuit layer forming unit 600, the display element layer forming unit 700, the thin-film encapsulation film forming unit 800, and the cutting unit 900 may be separately installed to sequentially feed a support substrate 10 to the respective units. For convenience of description, an example in which the flexible substrate forming unit 500, the pixel circuit layer forming unit 600, the display element layer forming unit 700, the thin-film encapsulation film forming unit 800, and the cutting unit 900 are separately installed will be described below.

The apparatus 1 for manufacturing the display device may further include other units as well as the above-described units. For example, the apparatus 1 for manufacturing the display device in accordance with an embodiment of the present disclosure may include all devices and structures for manufacturing a flexible display device (not shown).

In accordance with an embodiment of the present disclosure, the first unit 100 may be a cleaning unit to clean a surface of the support substrate 10 transferred from a loading unit (not shown). In this regard, the loading unit may be equipped with a separate moving means or unit, for example, a conveyor COV, to transfer the support substrate 10 to the first unit 100. That is, the support substrate 10 may be received and supported by the conveyor COV to be transferred from the loading unit to the first unit 100.

In an embodiment, the first unit 100 may perform dry cleaning on a surface of the support substrate 10, for example, a surface that is not supported by the conveyor COV. In an embodiment, the first unit 100 may spray oxygen plasma onto the support substrate 10 through a nozzle 110 located at an upper end of the first unit 100 to remove impurities from the surface of the support substrate 10. Here, the oxygen plasma may charge the surface of the support substrate 10 with a specific charge. When the above-described process has been completed, the support substrate 10 may be transferred by the conveyor COV to a next unit where a subsequent process is performed. The conveyor COV may be installed in the first unit 100 to pass through the first unit 100.

The support substrate 10 that has been cleaned in the first unit 100 may be moved to the second unit 200 by the conveyor COV.

The second unit 200 may form a sacrificial layer SCL on the support substrate 10. To this end, the second unit 200 may include first to third supply nozzles 210, 220, and 230 disposed on an upper end of the second unit 200.

In an embodiment, the first supply nozzle 210 may form a graphene oxide layer on the support substrate 10 by spraying a material that is bonded to the support substrate 10 by van der Waals bonding, for example, a graphene oxide solution, onto the support substrate 10. In an embodiment of the present disclosure, the method of spraying the graphene oxide solution onto the support substrate 10 may utilize any method selected from a group including dip coating, spray coating, spin coating, screen coating, offset printing, inkjet printing, pad printing, knife coating, kiss coating, gravure coating, brushing, ultrasonic fine spray coating, and spray-mist spray coating, without being limited thereto.

The second supply nozzle 220 dries the graphene oxide layer coated onto the support substrate 10 while eliminating a part of the layer, thus finally forming (or completing) the sacrificial layer SCL on the support substrate 10. In an embodiment, the second supply nozzle 220 may include an air knife to spray gas at high pressure onto the graphene oxide layer. The air knife may spray gas, for example, air, onto the graphene oxide layer to dry the graphene oxide layer and thereby form the sacrificial layer SCL on the support substrate 10. In an embodiment of the present disclosure, the graphene oxide layer dried by the second supply nozzle 220 may be ultimately the sacrificial layer SCL. The above-described air knife may remove the sacrificial layer SCL leaning to a specific portion on the support substrate 10 and uniformly form the sacrificial layer SCL on the support substrate 10.

In an embodiment, the third supply nozzle 230 may spray deionized (DI) water onto the graphene oxide layer that is coated onto the support substrate 10 by the first supply nozzle 210. In an embodiment of the present disclosure, the third supply nozzle 230 may be disposed between the first supply nozzle 210 and the second supply nozzle 220 to clean some of impurities of the graphene oxide layer on the support substrate 10.

In an embodiment of the present disclosure, the first supply nozzle 210, the third supply nozzle 230, and the second supply nozzle 220 may be interconnected in line in the second unit 200. In the second unit 200, the support substrate 10 may be sequentially moved to the first supply nozzle 210, the third supply nozzle 230, and the second supply nozzle 220 by the conveyor COV to perform the above processes, thus finally forming the sacrificial layer SCL on the support substrate 10.

In an embodiment of the present disclosure, the sacrificial layer SCL may be easily detached after the display device has been manufactured by adjusting tensile adhesion strength between the support substrate 10 and the sacrificial layer SCL by van der Waals bonding.

The support substrate 10 having the sacrificial layer SCL formed thereon may be transferred to the third unit 300 by the conveyor COV. The third unit 300 may be an unloading unit that carries the support substrate 10 to an outside. The support substrate 10 carried by the third unit 300 may be transferred to the flexible substrate forming unit 500.

The flexible substrate forming unit 500 may form a flexible substrate SUB on the sacrificial layer SCL. The flexible substrate forming unit 500 may apply an insulating material having flexibility to the sacrificial layer SCL through a slit nozzle 510 and then may cure the material, thus forming the flexible substrate SUB.

In an embodiment of the present disclosure, the flexible substrate SUB may be made of a material selected from a group including polyester, polyvinyl, polycarbonate, polyethylene, polyacetate, polyimide, polyether sulfone (PES), polyacrylate (PAR), polyethylene naphthalate (PEN), polyethylene terephthalate (PET), and others.

The support substrate 10 having the flexible substrate SUB formed thereon may be transferred to the pixel circuit layer forming unit 600. The pixel circuit layer forming unit 600 may form a pixel circuit layer containing at least one transistor on the flexible substrate SUB.

The support substrate 10 having the pixel circuit layer formed thereon may be transferred to the display element layer forming unit 700. The display element layer forming unit 700 may be electrically connected with the transistor and may form a display element layer containing a light emitting element on the pixel circuit layer.

The support substrate 10 having the display element layer formed thereon may be transferred to the thin-film encapsulation film forming unit 800. The thin-film encapsulation film forming unit 800 may form a thin-film encapsulation film covering the display element layer on the display element layer.

The support substrate 10 having the thin-film encapsulation film formed thereon may be transferred to the cutting unit 900. The cutting unit 900 may cut the support substrate 10 into a cell unit of the flexible display device. Particularly, the cutting unit 900 may cut the support substrate 10 into the cell unit to easily separate the flexible substrate SUB from the support substrate 10.

Meanwhile, if the sacrificial layer SCL has a structure in which a plurality of graphene oxide layers having different charges is stacked, the flexible substrate SUB on the sacrificial layer SCL and the support substrate 10 may be easily separated from each other. If the graphene oxide solution sprayed from the first supply nozzle 210 of the second unit 200 has a first charge, a process of coating the graphene oxide solution of a second charge having opposite characteristics to the charge of the graphene oxide solution onto the surface of the support substrate 10 may be added. In this case, the apparatus 1 for manufacturing the display device may further include a fourth unit 400 to coat the graphene oxide solution having the second charge onto the graphene oxide layer of the support substrate 10.

The fourth unit 400 may form the graphene oxide layer (herein referred to as a "second graphene oxide layer") having opposite characteristics to the charge of the graphene oxide layer on the graphene oxide layer of the support substrate 10 transferred by the conveyor COV from the second unit 200. To this end, the fourth unit 400 may include first to third supply nozzles 410 to 430, as in the second unit 200.

The first supply nozzle 410 of the fourth unit 400 may coat the graphene oxide solution having the second charge onto the support substrate 10 to form the second graphene oxide layer on the graphene oxide layer of the support substrate 10. The second supply nozzle 420 of the fourth unit 400 may dry the second graphene oxide layer while eliminating some of the layer. In an embodiment, the second supply nozzle 420 of the fourth unit 400 may include an air knife. The third supply nozzle 430 of the fourth unit 400 may spray DI water onto the second graphene oxide layer that is coated onto the support substrate 10 by the first supply nozzle 410 of the fourth unit 400. The third supply nozzle 430 of the fourth unit 400 may be disposed between the first supply nozzle 410 of the fourth unit 400 and the second supply nozzle 420 of the fourth unit 400.

In an embodiment of the present disclosure, the first supply nozzle 410 of the fourth unit 400, the third supply nozzle 430 of the fourth unit 400, and the second supply nozzle 420 of the fourth unit 400 may be interconnected in line in the fourth unit 400. In the fourth unit 400, the support substrate 10 may be sequentially moved by the conveyor COV to the first supply nozzle 410 of the fourth unit 400, the third supply nozzle 430 of the fourth unit 400, and the second supply nozzle 420 of the fourth unit 400, and then the above-described processes may be performed to finally form the sacrificial layer SCL, on which two graphene oxide layers having different charges are stacked, on the support substrate 10.

The support substrate 10 having the sacrificial layer SCL formed thereon may be transferred to the third unit 300 and then carried to the outside by the conveyor COV. Subsequently, the support substrate 10 may be transferred to the flexible substrate forming unit 500.

Figure 3A:
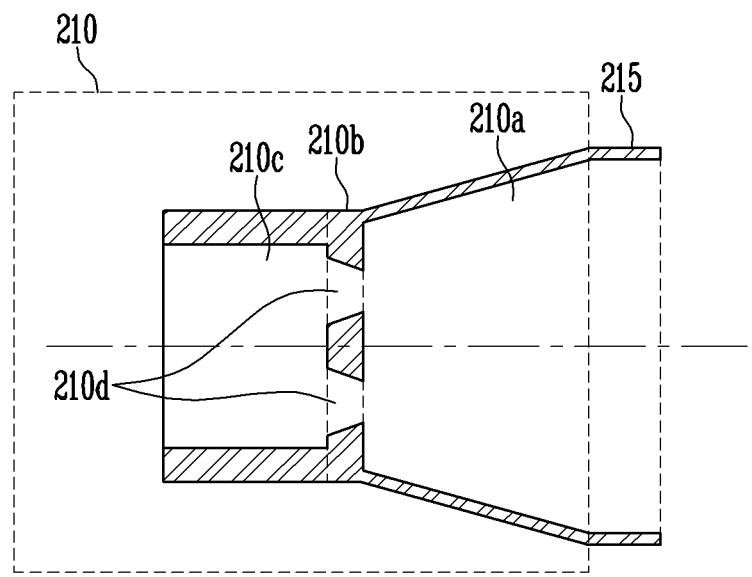
FIGS. 3A and 3B are diagrams illustrating a first supply nozzle of FIG. 2.
Figure 3B:
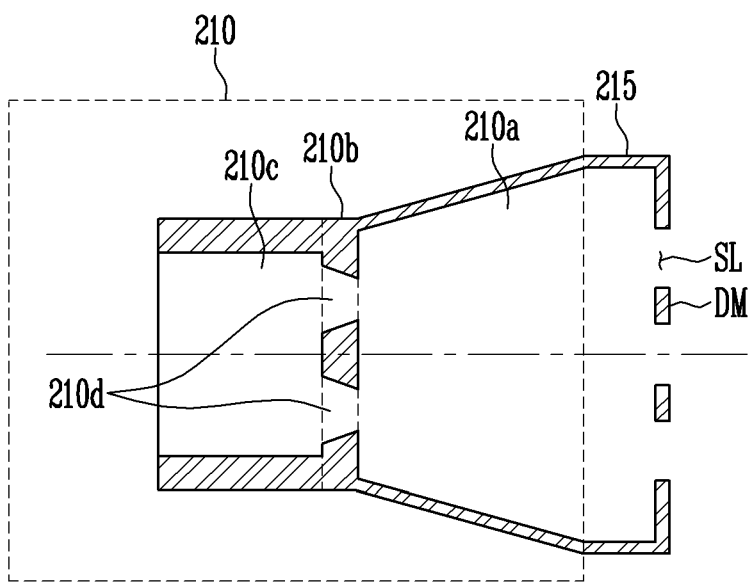

FIG. 2 is a view illustrating the second unit shown in FIG. 1; and FIGS. 3A and 3B are diagrams illustrating the first supply nozzle of FIG. 2.

Referring to FIGS. 1, 2, 3A, and 3B, the apparatus 1 for manufacturing the display device may include the second unit 200 to form the sacrificial layer SCL on the support substrate 10.

The second unit 200 may perform a process of forming the sacrificial layer SCL on the support substrate 10 transferred from the first unit 100. In an embodiment, the second unit 200 may include first to third supply nozzles 210 to 230, a frame 240, first to third supply sources 250a to 250c, first to third recovery nozzles 270a to 270c, and first to third filter parts 280a to 280c.

Each of the first to third supply nozzles 210 to 230 may be secured to the frame 240. In the second unit 200, the first to third supply nozzles 210 to 230 may be disposed on a surface of the frame 240 in the order of the first supply nozzle 210, the third supply nozzle 230, and the second supply nozzle 220. In an embodiment of the present disclosure, the frame 240 may be secured to an upper side of the second unit 200. However, without being limited thereto, according to an embodiment, the frame 240 may be moved by a moving means or unit (not shown) in a first direction, e.g. a direction shown by the arrow of FIG. 2.

In an embodiment of the present disclosure, the first supply nozzle 210 may be spaced apart from the third supply nozzle 230 by a distance (e.g. a predetermined distance) d1, and the third supply nozzle 230 may be spaced apart from the second supply nozzle 220 by a distance (e.g., a predetermined distance) d2. In an embodiment, the distance d1 between the first supply nozzle 210 and the third supply nozzle 230 may be about 50 mm, and the distance d2 between the third supply nozzle 230 and the second supply nozzle 220 may be about 50 mm. That is, in an embodiment, the distance d1 between the first supply nozzle 210 and the third supply nozzle 230 may be equal to the distance d2 between the third supply nozzle 230 and the second supply nozzle 220.

The first to third supply nozzles 210 to 230 are disposed on a surface of the frame 240 to be spaced apart from each other by a distance (e.g., a predetermined distance), such that materials sprayed from the respective supply nozzles are not mixed with each other.

The first supply nozzle 210 sprays (or applies) the graphene oxide solution that is to be bonded to the support substrate 10 by van der Waals bonding onto the support substrate 10, thus coating (or forming) the graphene oxide layer on the support substrate 10. To this end, the first supply nozzle 210 may include a first injection port 215 that is formed in the shape of a hollow tube for spraying (or applying) the graphene oxide solution onto the support substrate 10.

An injection angle θ1 of the first injection port 215 corresponds to an important parameter for uniformly spraying (or applying) the graphene oxide solution passing through the first injection port 215 onto the surface of the support substrate 10. In an embodiment of the present disclosure, the first injection port 215 may have the injection angle θ1 fixed within a range from 15° to 45°.

If the first injection port 215 has the injection angle θ1 less than 15°, a force for spraying the graphene oxide solution onto the surface of the support substrate 10 may be lowered. Further, if the first injection port 215 has the injection angle θ1 greater than 45°, the graphene oxide solution is sprayed (or applied) onto an area (e.g. an area where the graphene oxide solution has been already sprayed) that does not correspond to the first supply nozzle 210, thus making it difficult to uniformly form the graphene oxide layer throughout the surface of the support substrate 10.

In an embodiment of the present disclosure, a distance (or height) h between the surface of the support substrate 10 and the first injection port 215 may be 100 mm or less, but the present disclosure is not limited thereto. The distance (or height) h between the surface of the support substrate 10 and the first injection port 215 may vary according to the design conditions of the graphene oxide layer on the support substrate 10, the requirements of the display device to which the graphene oxide is applied, and others. In an embodiment, the first injection port 215 may be designed to spray the graphene oxide solution onto the support substrate 10 under the pressure of approximately 0.1 to 0.5 MPa and thereby rapidly coat (or form) the graphene oxide layer on the support substrate 10.

In an embodiment, as illustrated in FIG. 3A, the first supply nozzle 210 may include a solution reservoir 210a, a flow rate regulator 210b, a solution inlet part 210c, and an orifice 210d. The first supply nozzle 210 including the above-described components may be coupled with the first injection port 215. In an embodiment of the present disclosure, the solution reservoir 210a and the first injection port 215 may be integrally provided. In this case, the first injection port 215 may be one component included in the first supply nozzle 210.

The solution inlet part 210c is connected with the first supply source 250a via a first supply tube 260a to receive the graphene oxide solution from the first supply source 250a. The solution reservoir 210a accumulates the graphene oxide solution introduced from the solution inlet part 210c. The flow rate regulator 210b is situated between the solution inlet part 210c and the solution reservoir 210a to regulate the flow rate of the graphene oxide solution sprayed onto the surface of the support substrate 10. The flow rate regulator 210b may have the shape of a flat plate, and may include an orifice 210d to cause the graphene oxide solution to pass therethrough while reducing the flow rate of the graphene oxide solution. The orifice 210d may have a conical shape that becomes narrower towards the solution reservoir part 210a, but the present disclosure is not limited thereto.

In an embodiment, as illustrated in FIG. 3B, the first injection port 215 may include at least one slit SL and at least one dam DM. The slit SL of the first injection port 215 may be an outlet that sprays the graphene oxide solution accumulated in the solution reservoir 210a to the outside, for example, the surface of the support substrate 10. The dam DM of the first injection port 215 may further regulate the flow rate of the graphene oxide solution passing through the first injection port 215 to prevent or substantially prevent the graphene oxide solution from leaning to a specific portion of the support substrate 10.

Although an embodiment of the present disclosure has been described such that the first supply nozzle 210 has the above-described configuration, the present disclosure is not limited thereto. According to embodiments, the configuration and shape of the first supply nozzle 210 may be variously changed.

The graphene oxide solution sprayed onto areas other than the surface of the support substrate 10 through the first injection port 215 of the first supply nozzle 210 may be recovered by the first recovery nozzle 270a, and the graphene oxide solution recovered by the first recovery nozzle 270a may be fed through a first recovery tube 290a to the first filter part 280a. The first filter part 280a may include a filter that filters impurities contained in the graphene oxide solution. The first filter part 280a may supply the graphene oxide solution from which the impurities are removed to the first supply source 250a, and the first supply source 250a may supply the graphene oxide solution through the first supply tube 260a to the first supply nozzle 210.

The support substrate 10 coated with the graphene oxide layer by the first supply nozzle 210 may be moved by the conveyor COV to the third supply nozzle 230 in the direction of the arrow shown in FIG. 2.

The third supply nozzle 230 sprays the DI water onto the support substrate 10 coated with the graphene oxide layer to perform a rinse process for removing the impurities from the graphene oxide layer. To this end, the third supply nozzle 230 may include a third injection port 235 that is formed in the shape of a hollow tube for spraying the DI water onto the graphene oxide layer of the support substrate 10.

An injection angle θ2 of the third injection port 235 may correspond to a major parameter for uniformly spraying the DI water onto the graphene oxide layer of the support substrate 10. In an embodiment of the present disclosure, the injection angle θ2 of the third injection port 235 may be about 15° to 45°, similarly to the injection angle θ1 of the first injection port 215. In an embodiment, a distance (or height) h between the surface of the support substrate 10 and the third injection port 235 may be 100 mm or less, but the present disclosure is not limited thereto. In an embodiment, the third injection port 235 may spray the DI water onto the support substrate 10 under the pressure of approximately 0.1 to 0.5 MPa and thereby may rapidly clean the graphene oxide layer on the support substrate 10.

Although the third supply nozzle 230 is not shown in detail in the drawings, in an embodiment, it may have the same configuration as the first supply nozzle 210 shown in FIGS. 3A and 3B. For example, the third supply nozzle 230 may include a solution reservoir, a flow rate regulator, a solution inlet part, an orifice, and the third injection port 235.

The DI water sprayed onto areas other than the graphene oxide layer of the support substrate 10 through the third injection port 235 of the third supply nozzle 230 may be recovered by the third recovery nozzle 270c. Furthermore, the impurities contained in the graphene oxide layer of the support substrate 10 may be mixed with the DI water and then be recovered by the third recovery nozzle 270c. The DI water containing the impurities recovered by the third recovery nozzle 270c may be fed through a third recovery tube 290c to the third filter part 280c. The third filter part 280c may include a filter that filters the impurities contained in the DI water. The third filter part 280c may supply the DI water from which the impurities are removed to the third supply source 250c, and the third supply source 250c may supply the DI water through a third supply tube 260c to the third supply nozzle 230.

The support substrate 10 coated with the graphene oxide layer from which the impurities are removed by the third supply nozzle 230 may be moved by the conveyor COV to the second supply nozzle 220 in the direction of the arrow shown in FIG. 2.

The second supply nozzle 220 sprays gas onto the graphene oxide layer of the support substrate 10 to dry the graphene oxide layer while preventing or substantially preventing the graphene oxide layer from leaning to a specific portion, thus allowing the graphene oxide layer to be uniformly formed on the surface of the support substrate 10.

In an embodiment, the second supply nozzle 220 may include a second injection port 225 that is formed in the shape of a tube to spray gas, supplied from the second supply source 250b through a second supply tube 260b, onto the graphene oxide layer of the support substrate 10. An injection angle θ3 of the second injection port 225 may correspond to a major parameter for uniformly spraying gas onto the graphene oxide layer of the support substrate 10. In an embodiment, the injection angle θ3 of the second injection port 225 may be about 15° to 45°, similarly to the injection angle θ1 of the first supply nozzle 215.

In an embodiment of the present disclosure, the second injection port 225 may be designed to spray gas at high pressure onto the graphene oxide layer of the support substrate 10. In an embodiment, the second injection port 225 may spray gas onto the graphene oxide layer of the support substrate 10 under the pressure of approximately 0.1 to 0.5 MPa to rapidly dry the graphene oxide layer. In an embodiment, a distance (or height) h between the surface of the support substrate 10 and the second injection port 225 may be 100 mm or less, but the present disclosure is not limited thereto.

In an embodiment of the present disclosure, the second supply nozzle 220 may be composed of an air knife that sprays gas at high pressure onto the graphene oxide layer coated on the support substrate 10 to dry the graphene oxide layer. Some of the graphene oxide layer of the support substrate 10 and the DI water remaining on the graphene oxide layer may be separated from the support substrate 10 by the gas sprayed from the second injection port 225 and then may be recovered by the second recovery nozzle 270b. Some of the graphene oxide layer and the DI water remaining on the graphene oxide layer, which are recovered by the second recovery nozzle 270b, may be fed through a second recovery tube 290b to the second filter part 280b. The second filter part 280b may carry some of the graphene oxide layer and the DI water remaining on the graphene oxide layer to a residue collection tank (not shown).

In an embodiment of the present disclosure, the first filter part 280a is located in an area corresponding to the first supply nozzle 210 in the second unit 200, the second filter part 280b is located in an area corresponding to the second supply nozzle 220 in the second unit 200, and the third filter part 280c is located in an area corresponding to the third supply nozzle 230 in the second unit 200.

The graphene oxide layer of the support substrate 10 may be dried by gas sprayed from the second injection port 225 of the second supply nozzle 220. The graphene oxide layer dried on the support substrate 10 may be finally the sacrificial layer SCL.

The support substrate 10 including the sacrificial layer SCL formed on the second unit 200 may be transferred by the conveyor COV to the third unit 300 or, in an embodiment, to the fourth unit 400.

Figure 4A:
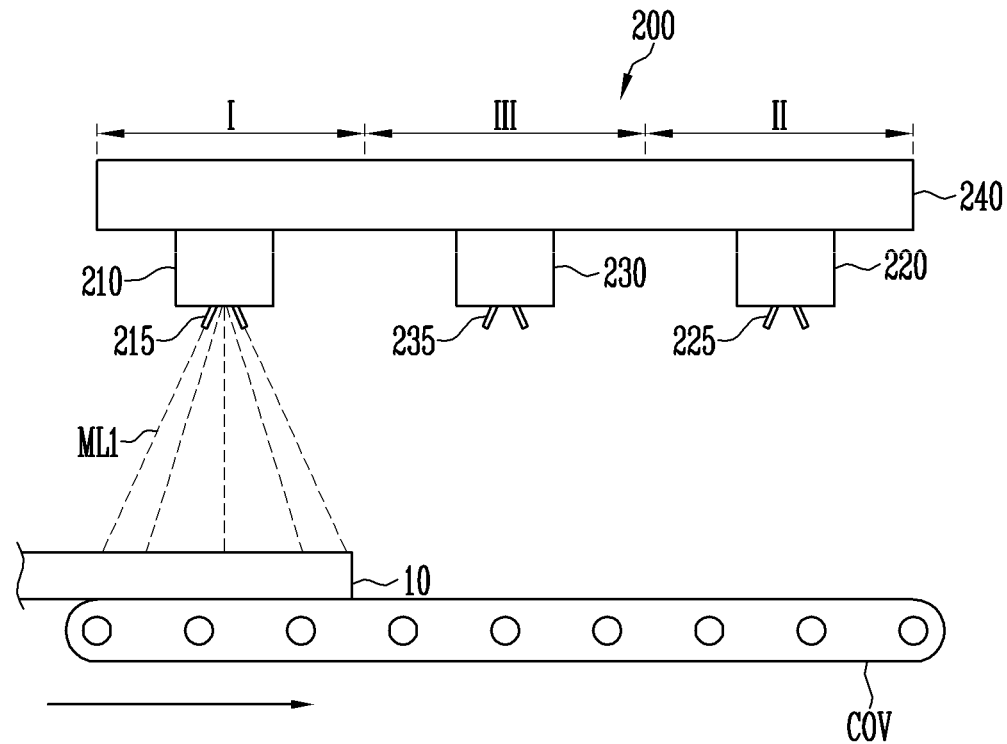
Figure 4B:
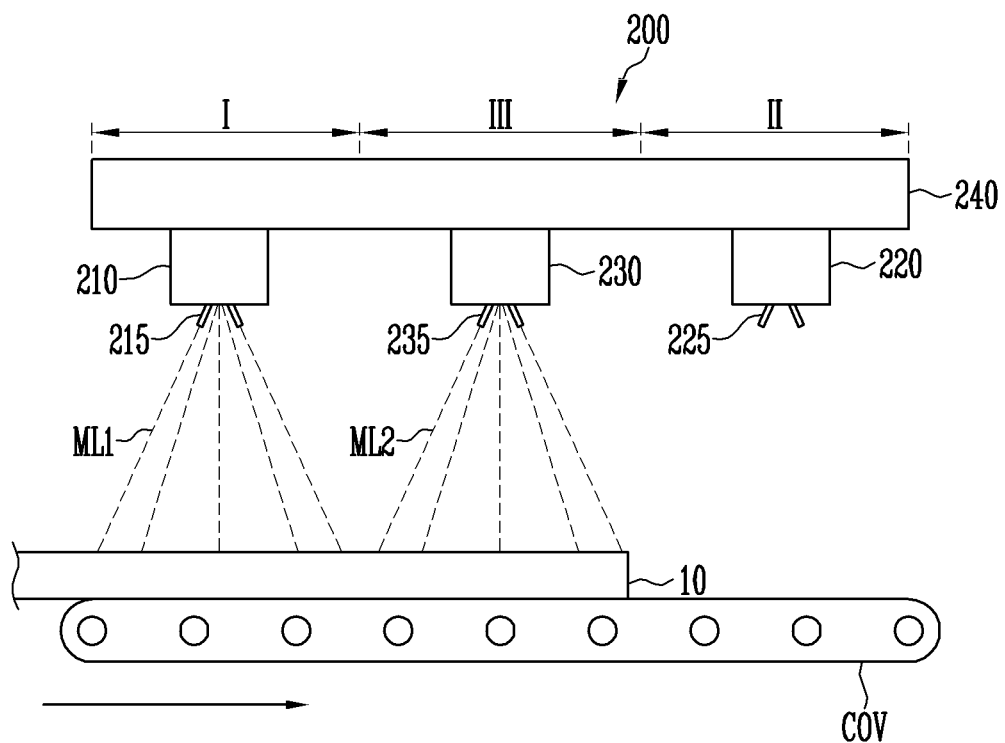
Figure 5A:
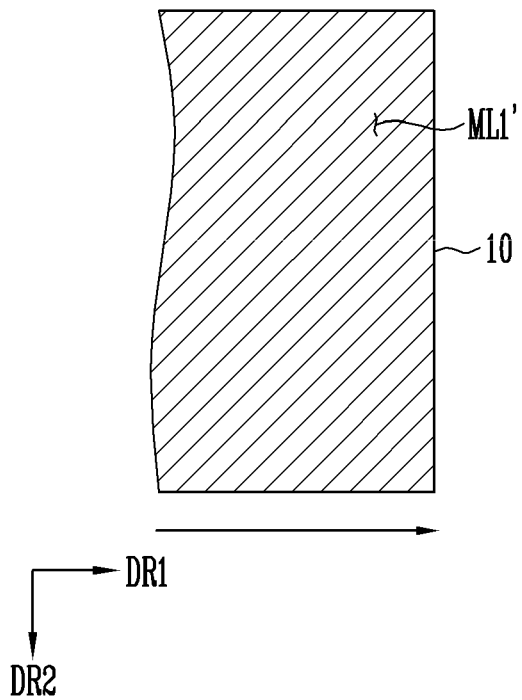
FIGS. 5A to 5C are plan views schematically illustrating a state in which the sacrificial layer is formed on the support substrate using the manufacturing process shown in FIGS. 4A to 4C.
Figure 5B:
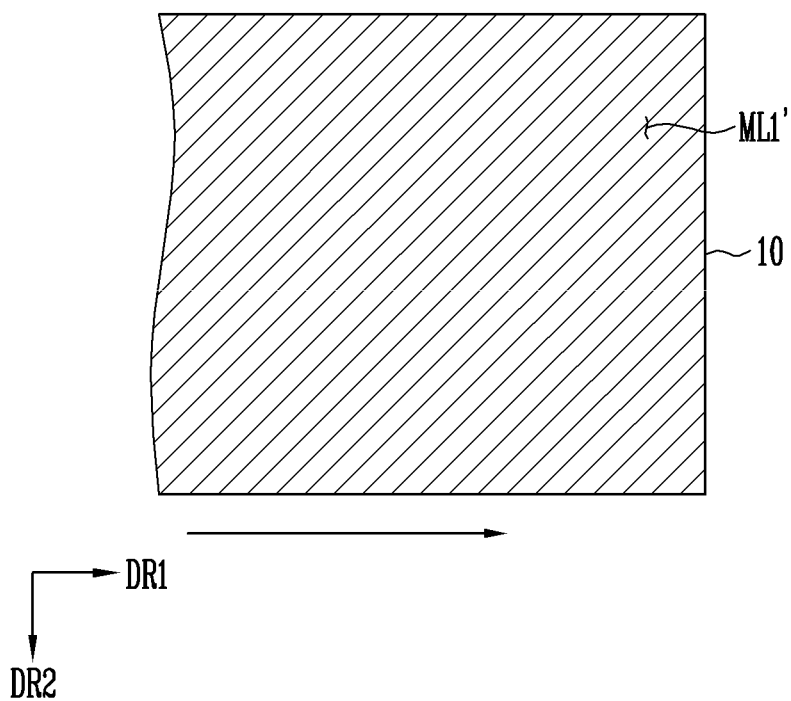
Figure 5C:
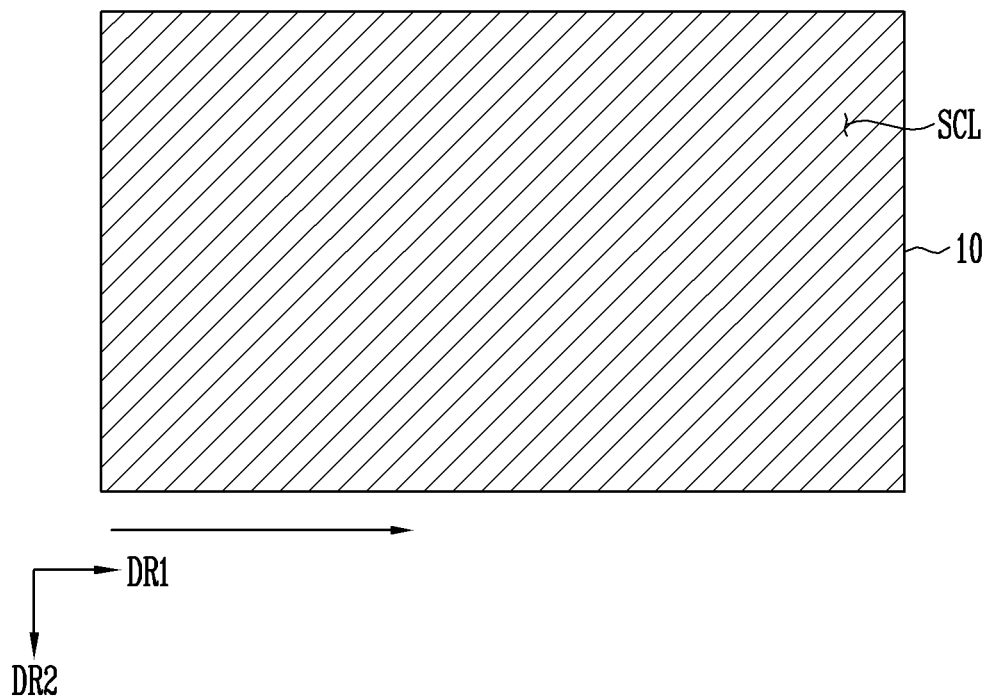

FIGS. 4A to 4C are diagrams schematically illustrating a manufacturing process for forming the sacrificial layer on the support substrate in the second unit of FIG. 2; and FIGS. 5A to 5C are plan views schematically illustrating a state in which the sacrificial layer is formed on the support substrate using the manufacturing process shown in FIGS. 4A to 4C.

For the convenience of illustration, FIGS. 4A to 4C illustrate only the first to third supply nozzles of the second unit, the frame, the conveyor, and the support substrate moved in a first direction by the conveyor.

As for the second unit of FIGS. 4A to 4C and FIGS. 5A to 5C, differences from the above-described embodiment will be mainly described in order to avoid a duplicated description thereof. Components which are not separately explained in the following description of the present disclosure may comply with that of the preceding embodiments. The same reference numerals will be used to designate the same components, and a similar reference numeral will be used to designate a similar component.

First, referring to FIGS. 1, 2, 4A, and 5A, the support substrate 10 transferred from the first unit 100 is moved in the second unit 200 by the conveyor COV in a first direction (herein, referred to as a "horizontal direction") shown by the arrow of FIG. 4A.

In an embodiment of the present disclosure, the second unit 200 may include a first area I, a second area II, and a third area III. The first area I of the second unit 200 is an area corresponding to the first supply nozzle 210, the third area III of the second unit 200 is an area corresponding to the third supply nozzle 230, and the second area II of the second unit 200 is an area corresponding to the second supply nozzle 220.

When the support substrate 10 is moved to the first area I by the conveyor COV in the second unit 200, the first supply nozzle 210 sprays a graphene oxide solution ML1 onto an associated area of the support substrate 10 through the first injection port 215. In an embodiment of the present disclosure, the associated area of the support substrate 10 means an area corresponding to the first area I.

The graphene oxide solution ML1 is sprayed onto the surface of the support substrate 10 corresponding to the first area I by the first supply nozzle 210 to form a graphene oxide layer ML1' on the surface of the support substrate 10 corresponding to the first supply nozzle 210.

Subsequently, referring to FIGS. 1, 2, 4A, 4B, 5A, and 5B, the support substrate 10 on which the graphene oxide layer ML1' is formed is moved by the conveyor COV in the horizontal direction to an area where the third supply nozzle 230 is located. That is, if the graphene oxide layer ML1' is formed on the surface of the support substrate 10 that is located in the first area I in the second unit 200, the support substrate 10 is moved to the third area III by the conveyor COV. Concurrently (e.g., simultaneously), the support substrate 10 that is not coated with the graphene oxide layer ML1' may be moved to the first area I by the conveyor COV.

In the third area III of the second unit 200, the third supply nozzle 230 sprays DI water ML2 onto the graphene oxide layer ML1' of the support substrate 10 so as to remove the impurities of the graphene oxide layer ML1' of the support substrate 10, thus cleaning the graphene oxide layer ML1'.

In the first area I of the second unit 200, the first supply nozzle 210 sprays the graphene oxide layer ML1 onto the support substrate 10 corresponding to the first area I, thus forming the graphene oxide layer ML1' on the support substrate 10.

Subsequently, referring to FIGS. 1, 2, 4A to 4C, and 5A to 5C, the support substrate 10 including the graphene oxide layer ML1', which has been cleaned by the third supply nozzle 230, is moved by the conveyor COV in the horizontal direction to an area where the second supply nozzle 220 is located. That is, if the graphene oxide layer ML1' of the support substrate 10 located in the third area III in the second unit 200 is cleaned, the support substrate 10 is moved to the second area II by the conveyor COV.

Concurrently (e.g., simultaneously), the support substrate 10 having the graphene oxide layer ML1' formed on the surface thereof by the first supply nozzle 210 is moved by the conveyor COV in the horizontal direction to an area where the third supply nozzle 230 is located. That is, if the graphene oxide layer ML1' is coated (formed) on the support substrate 10 that is located in the first area I of the second unit 200, the support substrate 10 is moved to the third area III by the conveyor COV. Concurrently (e.g., simultaneously), the support substrate 10 on which the graphene oxide layer ML1' is not formed may be moved to the first area I by the conveyor COV.

In the second area II of the second unit 200, the second supply nozzle 220 sprays gas ML3 to dry the cleaned graphene oxide layer ML1' on the support substrate 10, thus finally forming the sacrificial layer SCL on the support layer 10. Concurrently (e.g., simultaneously), in the third area III of the second unit 200, the third supply nozzle 230 sprays the DI water onto the graphene oxide layer ML1' of the support substrate 10 to clean the graphene oxide layer ML1'. Concurrently (e.g., simultaneously), in the first area I of the second unit 200, the first supply nozzle 210 sprays the graphene oxide layer ML1 on the support substrate 10, thus forming the graphene oxide layer ML1' on the surface of the support substrate 10.

If the sacrificial layer SCL is finally formed on the support substrate 10 in the second area II, the support substrate 10 is moved in the horizontal direction by the conveyor COV for a subsequent process.

The support substrate 10 including the graphene oxide layer ML1', which has been cleaned in the third area III, is moved by the conveyor COV in the horizontal direction to the second area II to be dried by the second nozzle 220. Thus, the sacrificial layer SCL is finally formed on the surface of the support substrate 10. If the sacrificial layer SCL is finally formed on the surface of the support substrate 10, the support substrate 10 is moved in the horizontal direction by the conveyor COV for a subsequent process.

The support substrate 10 on which the graphene oxide layer ML1' is formed in the first area I is moved by the conveyor COV in the horizontal direction to the third area III and then is cleaned by the third supply nozzle 230. If the cleaning process has been completed in the third area III, the support substrate is moved to the second area II to be dried by the second nozzle 220, such that the sacrificial layer SCL can be finally formed on the support substrate 10.

As described above, a process of forming the graphene oxide layer ML1' on the support substrate 10, a process of cleaning the graphene oxide layer ML1', and a process of drying the graphene oxide layer ML1' may be sequentially carried out along a line, such that the manufacturing time required to form the sacrificial layer SCL on the support substrate 10 may be shortened. Thus, in mass production, productivity of a product may be improved, as compared to a case in which a process of forming the graphene oxide layer ML1', a process of cleaning the graphene oxide layer ML1', and a process of drying the graphene oxide layer ML1' are performed in separate units.

Figure 6A:
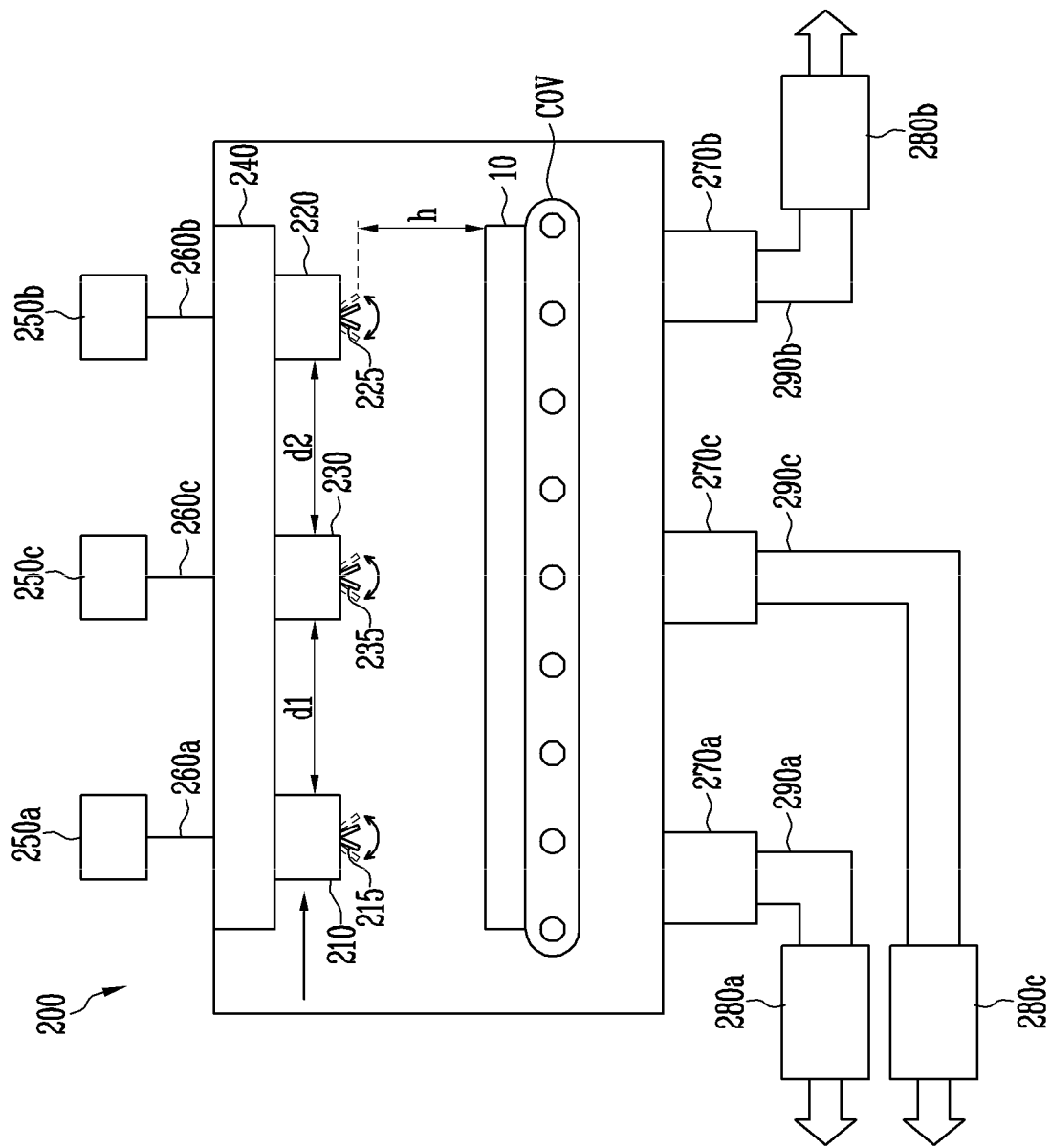
FIG. 6A is a diagram illustrating the second unit of FIG. 2 in accordance with another embodiment.

FIG. 6A is a diagram illustrating the second unit of FIG. 2 in accordance with another embodiment.

The second unit shown in FIG. 6A may have substantially a same or similar configuration as the second unit of FIG. 2, except that the injection port of each supply nozzle is not fixed but is movable, and each supply nozzle is moved in a specific direction.

Hence, as for the second unit of FIG. 6A, differences from the above-described embodiment will be mainly described in order to avoid a duplicated description thereof. Components which are not separately explained in the following description of the present embodiment may comply with the description of the preceding embodiments. The same reference numerals will be used to designate the same components, and a similar reference numeral will be used to designate a similar component.

Referring to FIGS. 1 and 6A, the second unit 200 performs the process of forming the sacrificial layer SCL on the support substrate 10 transferred from the first unit 100. In an embodiment, the second unit 200 may include first to third supply nozzles 210 to 230, a frame 240, first to third supply sources 250a to 250c, first to third recovery nozzles 270a to 270c, and first to third filter parts 280a to 280c.

Each of the first to third supply nozzles 210 to 230 may be secured to the frame 240. The frame 240 may be moved by a moving means or unit (not shown) in the direction shown by the arrow of FIG. 6A. The first supply nozzle 210 may be spaced apart from the third supply nozzle 230 by a distance (e.g., a predetermined distance) d1, and the third supply nozzle 230 may be spaced apart from the second supply nozzle 220 by a distance (e.g., a predetermined distance) d2. The first to third supply nozzles 210 to 230 are disposed on a surface of the frame 240 to be spaced apart from each other by a distance (e.g., a predetermined distance), such that materials sprayed from the respective supply nozzles are not mixed with each other.

The first supply nozzle 210 may include the first injection port 215 for spraying the graphene oxide solution onto the support substrate 10, the third supply nozzle 230 may include the third injection port 235 for spraying the DI water onto the support substrate 10, and the second supply nozzle 220 may include the second injection port 225 for spraying gas onto the support substrate 10.

In an embodiment, each of the first to third injection ports 215, 225, and 235 may be repeatedly narrowed and widened at its outlet within the range of the injection angle of about 15° to 45°. In an embodiment, the narrowing the outlet such that each of the first to third injection ports 215, 225 and 235 has the injection angle of a minimum of 15° and of widening the outlet such that each of the first to third injection ports 215, 225, and 235 has the injection angle of a maximum of 45° may be repeatedly performed while spraying an associated material stored in each supply nozzle onto the support substrate 10 corresponding to each supply nozzle.

The first injection port 215 may spray the graphene oxide solution onto the support substrate 10 corresponding to the first supply nozzle 210 while its outlet is narrowed and widened within the range of the injection angle of about 15° to 45°. The third injection port 235 may spray the DI water onto the support substrate 10 corresponding to the third supply nozzle 230 while its outlet is narrowed and widened within the range of the injection angle of about 15° to 45°. Further, the second injection port 225 may spray gas onto the support substrate 10 corresponding to the second supply nozzle 220 while its outlet is narrowed and widened within the range of the injection angle of about 15° to 45°.

In the second unit 200, after the support substrate 10 on the conveyor COV is fixed and each supply nozzle has sprayed the material stored in the respective supply nozzle onto the support substrate 10, the frame 240 may be moved in the direction shown by the arrow of FIG. 6A.

FIG. 6B is a diagram illustrating the second unit of FIG. 2 in accordance with another embodiment.

The second unit shown in FIG. 6B may have substantially a same or similar configuration as the second unit of FIG. 2, except that it includes a plurality of subsidiary supply nozzles and the injection port of each subsidiary supply nozzle is movable.

Hence, as for the second unit of FIG. 6B, differences from the above-described embodiment will be mainly described in order to avoid a duplicated description thereof. Components which are not separately explained in the following description of the present embodiment may comply with the description of the preceding embodiments. The same reference numerals will be used to designate the same components, and a similar reference numeral will be used to designate a similar component.

Referring to FIGS. 1 and 6B, the second unit 200 performs the process of forming the sacrificial layer SCL on the support substrate 10 transferred from the first unit 100. In an embodiment, the second unit 200 may include first to third supply nozzles 210 to 230, a frame 240, first to third supply sources 250a to 250c, first to third recovery nozzles 270a to 270c, and first to third filter parts 280a to 280c.

The first supply nozzle 210 may include at least one first subsidiary supply nozzle to spray the graphene oxide solution onto the support substrate 10. For example, the first supply nozzle 210 may include 1-1-th to 1-4-th subsidiary supply nozzles 210a to 210d. In an embodiment of the present disclosure, each of the 1-1-th to 1-4-th subsidiary supply nozzles 210a to 210d may be provided on a surface of the frame 240 to be spaced apart from an adjacent first subsidiary supply nozzle by a distance (e.g., a predetermined distance).

The 1-1-th subsidiary supply nozzle 210a may include a 1-1-th subsidiary injection port 215a, the 1-2-th subsidiary supply nozzle 210b may include a 1-2-th subsidiary injection port 215b, the 1-3-th subsidiary supply nozzle 210c may include a 1-3-th subsidiary injection port 215c, and the 1-4-th subsidiary supply nozzle 210d may include a 1-4-th subsidiary injection port 215d. The 1-1-th to the 1-4-th subsidiary injection ports 215a to 215d may constitute the first injection port 215.

In an embodiment, each of the 1-1-th to 1-4-th subsidiary injection ports 215a to 215d may be repeatedly narrowed and widened at its outlet within the range of the injection angle of about 15° to 45°. In an embodiment, the narrowing the outlet such that each of the 1-1-th to 1-4-th subsidiary injection ports 215a to 215d has the injection angle of a minimum of 15° and of widening the outlet such that each of the subsidiary injection ports has the injection angle of a maximum of 45° may be repeatedly performed while spraying the graphene oxide material stored in each of the 1-1-th to 1-4-th subsidiary supply nozzles 210a to 210d onto the support substrate 10 corresponding to each first subsidiary nozzle.

In an embodiment of the present disclosure, each of the 1-1-th to 1-4-th subsidiary injection ports 215a to 215d may be disposed on a surface of the frame 240 to be spaced apart from an adjacent subsidiary injection port by a distance (e.g., a predetermined distance).

If the graphene oxide solution is sprayed onto the support substrate 10 corresponding to the first supply nozzle 210 to form the graphene oxide layer on the support substrate 10, the support substrate 10 is moved to the third supply nozzle 230 by the conveyor COV.

The third supply nozzle 230 may include at least one third subsidiary supply nozzle to spray the DI water onto the graphene oxide layer of the support substrate 10. For example, the third supply nozzle 230 may include 3-1-th to 3-4-th subsidiary supply nozzles 230a to 230d. The 3-1-th subsidiary supply nozzle 230a may include a 3-1-th subsidiary injection port 235a, the 3-2-th subsidiary supply nozzle 230b may include a 3-2-th subsidiary injection port 235b, the 3-3-th subsidiary supply nozzle 230c may include a 3-3-th subsidiary injection port 235c, and the 3-4-th subsidiary supply nozzle 230d may include a 3-4-th subsidiary injection port 235d. The 3-1-th to 3-4-th subsidiary injection ports 235a to 235d may constitute the third injection port 235.

In an embodiment, each of the 3-1-th to 3-4-th subsidiary injection ports 235a to 235d may be repeatedly narrowed and widened at its outlet within the range of the injection angle of about 15° to 45°. In an embodiment, the narrowing the outlet such that each of the 3-1-th to 3-4-th subsidiary injection ports 235a to 235d has the injection angle of a minimum of 15° and of widening the outlet such that each of the subsidiary injection ports has the injection angle of a maximum of 45° may be repeatedly performed while spraying the DI water stored in each of the 3-1-th to 3-4-th subsidiary supply nozzles 230a to 230d onto the support substrate 10 corresponding to each third subsidiary nozzle.

In an embodiment of the present disclosure, each of the 3-1-th to 3-4-th subsidiary injection ports 315a to 315d may be disposed on a surface of the frame 240 to be spaced apart from an adjacent subsidiary injection port by a distance (e.g., a predetermined distance).

After the graphene oxide layer is cleaned by spraying the DI water on the graphene oxide layer of the support substrate 10 corresponding to the third supply nozzle 230, the support substrate 10 is moved to the second supply nozzle 220 by the conveyor COV.

The second supply nozzle 220 may include at least one second subsidiary supply nozzle to spray gas onto the graphene oxide layer of the support substrate 10. For example, the second supply nozzle 220 may include 2-1-th to 2-4-th subsidiary supply nozzles 220a to 220d. The 2-1-th subsidiary supply nozzle 220a may include a 2-1-th subsidiary injection port 225a, the 2-2-th subsidiary supply nozzle 220b may include a 2-2-th subsidiary injection port 225b, the 2-3-th subsidiary supply nozzle 220c may include a 2-3-th subsidiary injection port 225c, and the 2-4-th subsidiary supply nozzle 220d may include a 2-4-th subsidiary injection port 225d. The 2-1-th to 2-4-th subsidiary injection ports 225a to 225d may constitute the second injection port 225.

In an embodiment, each of the 2-1-th to 2-4-th subsidiary injection ports 225a to 225d may be repeatedly narrowed and widened at its outlet within the range of the injection angle of about 15° to 45°. In an embodiment, the narrowing the outlet such that each of the 2-1-th to 2-4-th subsidiary injection ports 225a to 225d has the injection angle of a minimum of 15° and of widening the outlet such that each of the subsidiary injection ports has the injection angle of a maximum of 45° may be repeatedly performed while spraying gas stored in each of the 2-1-th to 2-4-th subsidiary supply nozzles 220a to 220d onto the support substrate 10 corresponding to each second subsidiary nozzle.

In an embodiment of the present disclosure, each of the 2-1-th to 2-4-th subsidiary injection ports 225a to 225d may be disposed on a surface of the frame 240 to be spaced apart from an adjacent subsidiary injection port by a distance (e.g., a predetermined distance).

If the sacrificial layer SCL is finally formed on the entire surface of the support substrate 10 by spraying gas onto the graphene oxide layer of the support substrate 10 corresponding to the second supply nozzle 220 and then drying the graphene oxide layer, the support substrate 10 having the sacrificial layer SCL may be carried out of the second unit 200 by the conveyor COV and be transferred to a unit for performing a subsequent process.

FIG. 6C is a diagram illustrating the second unit of FIG. 2 in accordance with another embodiment.

The second unit shown in FIG. 6C may have substantially a same or similar configuration as the second unit of FIG. 6B, except that the support substrate is fixed.

Hence, as for the second unit of FIG. 6C, differences from the above-described embodiment will be mainly described in order to avoid a duplicated description thereof. Components which are not separately explained in the following description of the present embodiment may comply with the description of the preceding embodiments. The same reference numerals will be used to designate the same components, and a similar reference numeral will be used to designate a similar component.

Referring to FIGS. 1 and 6C, the second unit 200 performs the process of forming the sacrificial layer SCL on the support substrate 10 transferred from the first unit 100. In an embodiment, the second unit 200 may include first to third supply nozzles 210 to 230, a frame 240, first to third supply sources 250a to 250c, first to third recovery nozzles 270a to 270c, and first to third filter parts 280a to 280c.

The first supply nozzle 210 may include the 1-1-th to 1-4-th subsidiary supply nozzles 210a to 210d to spray the graphene oxide solution onto the support substrate 10. The 1-1-th subsidiary supply nozzle 210a may include a 1-1-th subsidiary injection port 215a, the 1-2-th subsidiary supply nozzle 210b may include a 1-2-th subsidiary injection port 215b, the 1-3-th subsidiary supply nozzle 210c may include a 1-3-th subsidiary injection port 215c, and the 1-4-th subsidiary supply nozzle 210d may include a 1-4-th subsidiary injection port 215d.

In an embodiment, each of the 1-1-th to 1-4-th subsidiary injection ports 215a to 215d may be repeatedly narrowed and widened at its outlet within the range of the injection angle of about 15° to 45° while spraying the graphene oxide solution onto the support substrate 10 corresponding to each first subsidiary supply nozzle.

If the graphene oxide solution is sprayed onto the support substrate 10 corresponding to the first supply nozzle 210 to coat (form) the graphene oxide layer on the support substrate 10, the frame 240 may be moved in a direction in the second unit 200 after a period of time (e.g., a predetermined period of time) has passed. Thus, the graphene oxide layer formed on the support substrate 10 by the first supply nozzle 210 may correspond to the third supply nozzle 230.

The third supply nozzle 230 may include the 3-1-th to 3-4-th subsidiary supply nozzles 230a to 230d to spray the DI water onto the graphene oxide layer of the support substrate 10. The 3-1-th subsidiary supply nozzle 230a may include a 3-1-th subsidiary injection port 235a, the 3-2-th subsidiary supply nozzle 230b may include a 3-2-th subsidiary injection port 235b, the 3-3-th subsidiary supply nozzle 230c may include a 3-3-th subsidiary injection port 235c, and the 3-4-th subsidiary supply nozzle 230d may include a 3-4-th subsidiary injection port 235d.

In an embodiment, each of the 3-1-th to 3-3-th subsidiary injection ports 235a to 235d may be repeatedly narrowed and widened at its outlet within the range of the injection angle of about 15° to 45° while spraying the DI water onto the graphene oxide layer of the support substrate 10 corresponding to each third subsidiary supply nozzle.

If the DI water is sprayed onto the graphene oxide layer of the support substrate 10 corresponding to the third supply nozzle 230 to clean the graphene oxide layer, the frame 240 may be moved in a direction in the second unit 200 after a period of time (e.g., a predetermined period of time) has passed. Thus, the graphene oxide layer that has been cleaned by the third supply nozzle 230 may correspond to the second supply nozzle 220.

The second supply nozzle 220 may include the 2-1-th to 2-4-th subsidiary supply nozzles 220a to 220d to spray gas onto the graphene oxide layer that has been cleaned and then dry the graphene oxide layer. The 2-1-th subsidiary supply nozzle 220a may include a 2-1-th subsidiary injection port 225a, the 2-2-th subsidiary supply nozzle 220b may include a 2-2-th subsidiary injection port 225b, the 2-3-th subsidiary supply nozzle 220c may include a 2-3-th subsidiary injection port 225c, and the 2-4-th subsidiary supply nozzle 220d may include a 2-4-th subsidiary injection port 225d.

In an embodiment, each of the 2-1-th to 2-4-th subsidiary injection ports 225a to 225d may be repeatedly narrowed and widened at its outlet within the range of the injection angle of about 15° to 45° while spraying gas onto the graphene oxide layer of the support substrate 10 corresponding to each second subsidiary supply nozzle. The graphene oxide layer of the support substrate 10 may be dried by gas sprayed from each second subsidiary supply nozzle, such that the sacrificial layer SCL may be finally formed on the support substrate 10.

FIG. 6D is a diagram illustrating the second unit of FIG. 2 in accordance with another embodiment.

The second unit shown in FIG. 6D may have substantially a same or similar configuration as the second unit of FIG. 6A, except that the injection port of each supply nozzle includes two subsidiary nozzles and the support substrate is fixed.

Hence, as for the second unit of FIG. 6D, differences from the above-described embodiment will be mainly described in order to avoid a duplicated description thereof. Components which are not separately explained in the following description of the present embodiment may comply with the description of the preceding embodiments. The same reference numerals will be used to designate the same components, and a similar reference numeral will be used to designate a similar component.

Referring to FIGS. 1 and 6D, the second unit 200 performs the process of forming the sacrificial layer SCL on the support substrate 10 transferred from the first unit 100. In an embodiment, the second unit 200 may include first to third supply nozzles 210 to 230, a frame 240, first to third supply sources 250a to 250c, first to third recovery nozzles 270a to 270c, and first to third filter parts 280a to 280c.

The first supply nozzle 210 includes 1-1-th and 1-2-th subsidiary injection ports 215a and 215b that spray the graphene oxide solution onto the support substrate 10 and are spaced apart from each other on a same plane. In an embodiment, each of the 1-1-th and 1-2-th subsidiary injection ports 215a and 215b may have the injection angle fixed within a range from 15° to 45°. In an embodiment of the present disclosure, the 1-1-th and 1-2-th subsidiary injection ports 215a and 215b may be concurrently (e.g., simultaneously) and repeatedly moved leftwards and rightwards in a first direction and a direction opposite to the first direction in the second unit 200 to spray the graphene oxide solution onto the support substrate 10. In this regard, the first direction may be a direction from the first supply nozzle 210 to the second supply nozzle 220, while the direction opposite to the first direction may be a direction from the second supply nozzle 220 to the first supply nozzle 210.

If the graphene oxide solution is sprayed onto the support substrate 10 corresponding to the first supply nozzle 210 to coat (form) the graphene oxide layer on the support substrate 10, the support substrate 10 is moved to the third supply nozzle 230 by the conveyor COV.

The third supply nozzle 230 includes 3-1-th and 3-2-th subsidiary injection ports 235a and 235b to spray the DI water onto the graphene oxide layer of the support substrate 10. In an embodiment, each of the 3-1-th and 3-2-th subsidiary injection ports 235a and 235b may have the injection angle fixed within a range from 15° to 45°. In an embodiment of the present disclosure, the 3-1-th and 3-2-th subsidiary injection ports 235a and 235b may be concurrently (e.g., simultaneously) and repeatedly moved leftwards and rightwards in a first direction and a direction opposite to the first direction in the second unit 200 to spray the DI water onto the graphene oxide layer of the support substrate 10.

After the graphene oxide layer is cleaned by spraying the DI water on the graphene oxide layer of the support substrate 10 corresponding to the third supply nozzle 230, the support substrate 10 is moved to the second supply nozzle 220 by the conveyor COV.

The second supply nozzle 220 includes 2-1-th and 2-2-th subsidiary injection ports 225a and 225b to spray gas onto the graphene oxide layer of the support substrate 10 and thereby dry the graphene oxide layer. In an embodiment, each of the 2-1-th and 2-2-th subsidiary injection ports 225a and 225b may have the injection angle fixed within a range from 15° to 45°. In an embodiment of the present disclosure, the 2-1-th and 2-2-th subsidiary injection ports 225a and 225b may be concurrently (e.g., simultaneously) and repeatedly moved leftwards and rightwards in a first direction and a direction opposite to the first direction in the second unit 200 to spray gas onto the graphene oxide layer of the support substrate 10 and thereby dry the graphene oxide layer.

Figure 7:
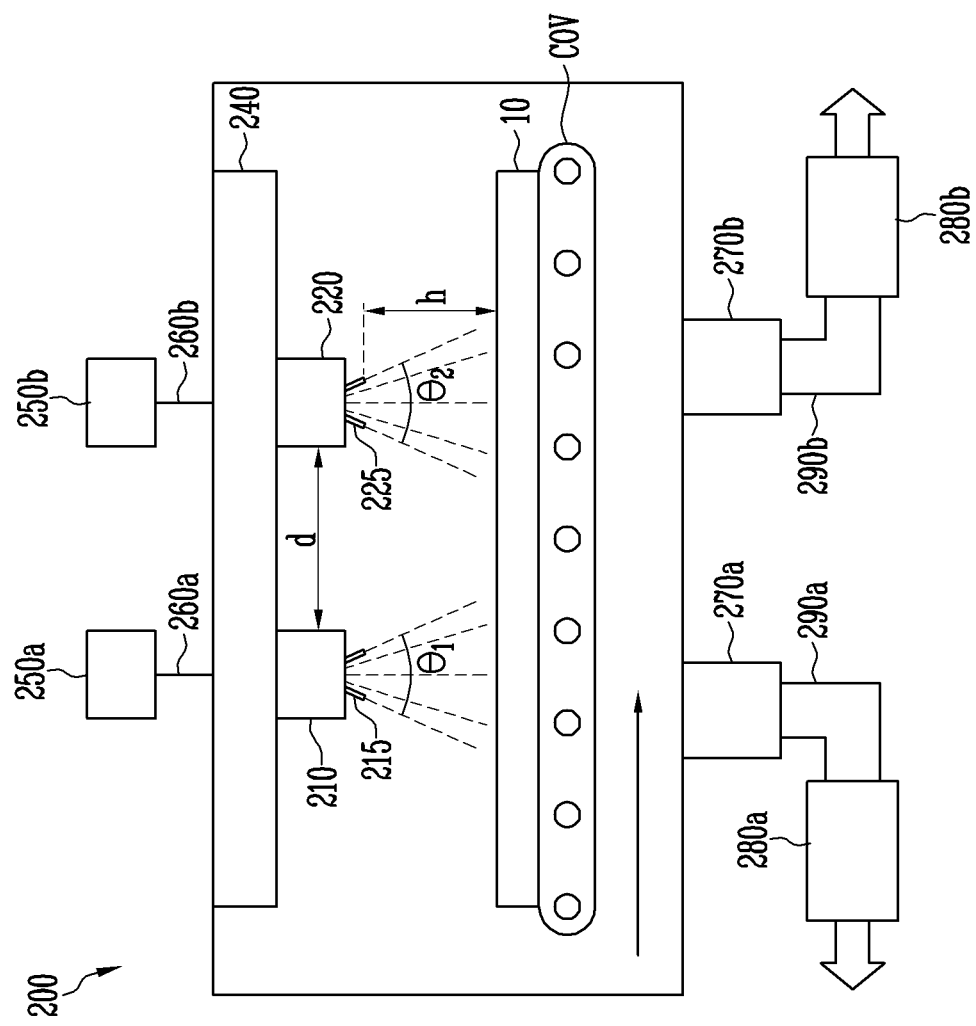
FIG. 7 is a diagram illustrating the second unit of FIG. 2 in accordance with another embodiment.

FIG. 7 is a diagram illustrating the second unit of FIG. 2 in accordance with another embodiment.

The second unit shown in FIG. 7 may have substantially a same or similar configuration as the second unit of FIG. 2, except that the third supply nozzle for spraying the DI water is omitted.

Hence, as for the second unit of FIG. 7, differences from the above-described embodiment will be mainly described in order to avoid a duplicated description thereof. Components which are not separately explained in the following description of the present embodiment may comply with the description of the preceding embodiments. The same reference numerals will be used to designate the same components, and a similar reference numeral will be used to designate a similar component.

Referring to FIGS. 1 and 7, the second unit 200 performs the process of forming the sacrificial layer SCL on the support substrate 10 transferred from the first unit 100. In an embodiment, the second unit 200 may include first and second supply nozzles 210 and 220, a frame 240, first and second supply sources 250a and 250b, first and second recovery nozzles 270a and 270b, and first and second filter parts 280a and 280b.

The first supply nozzle 210 and the second supply nozzle 220 may be disposed on a surface of the frame 240 to be spaced apart from each other by a distance (e.g., a predetermined distance). In an embodiment, the distanced between the first supply nozzle 210 and the second supply nozzle 220 may be 50 mm.

The first supply nozzle 210 includes a first injection port 215 to spray the graphene oxide solution onto the support substrate 10. In an embodiment, the first injection port 215 has the injection angle fixed within a range from 15° to 45°, and sprays the graphene oxide solution onto the support substrate 10. The first supply nozzle 210 sprays the graphene oxide solution onto the support substrate 10 to coat (form) the graphene oxide layer on the support substrate 10. If the graphene oxide layer is coated (or formed) on the support substrate 10, the support substrate 10 is moved to the second supply nozzle 220 by the conveyor COV.

The second supply nozzle 220 includes a second injection port 225 to spray gas onto the graphene oxide layer of the support substrate 10. In an embodiment, the second injection port 225 has the injection angle fixed within a range from 15° to 45°, and sprays gas onto the graphene oxide layer of the support substrate 10 to dry the graphene oxide layer and remove impurities of the graphene oxide layer. The second supply nozzle 220 sprays gas onto the graphene oxide layer of the support substrate 10 to dry the graphene oxide layer, thus finally forming the sacrificial layer SCL on the entire surface of the support substrate 10.

Figure 8:
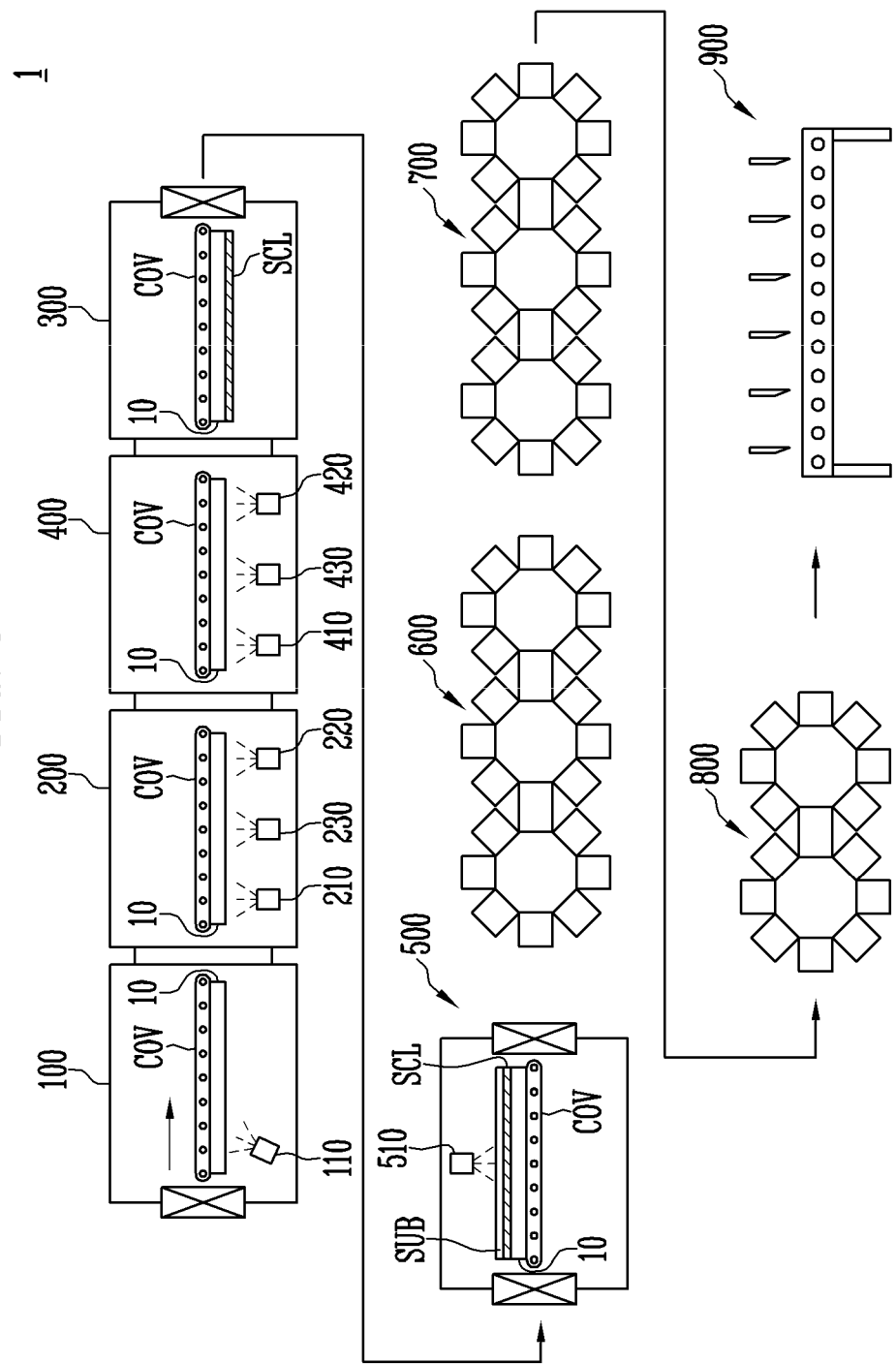
FIG. 8 is a conceptual view schematically illustrating an apparatus for manufacturing a display device in accordance with another embodiment of the present disclosure.

FIG. 8 is a conceptual view schematically illustrating an apparatus for manufacturing a display device in accordance with another embodiment of the present disclosure.

The apparatus for manufacturing the display device shown in FIG. 8 may have substantially a same or similar configuration as the apparatus for manufacturing the display device of FIG. 1, except that the support substrate is transferred in the first to fourth units while being positioned on a back surface of the conveyor.

Hence, as for the apparatus for manufacturing the display device of FIG. 8, differences from the above-described embodiment will be mainly described in order to avoid a duplicated description thereof. Components which are not separately explained in the following description of the present embodiment may comply with the description of the preceding embodiments. The same reference numerals will be used to designate the same components, and a similar reference numeral will be used to designate a similar component.

Referring to FIG. 8, the apparatus 1 for manufacturing the display device in accordance with another embodiment of the present disclosure may include first to fourth units 100 to 400, a flexible substrate forming unit 500, a pixel circuit layer forming unit 600, a display element layer forming unit 700, a thin-film encapsulation film forming unit 800, and a cutting unit 900. Respective units may be connected to each other by a separate transfer means (not shown), a connecting means (not shown), or the like.

The first unit 100 may dry clean the support substrate 10 supported on the back surface (or lower surface) of the conveyor COV. In an embodiment, the first unit 100 may spray oxygen plasma onto the support substrate 10 using the nozzle 110 located at a lower end of the first unit 100 to remove impurities from the surface of the support substrate 10.

When the above-described process has been completed, the support substrate 10 may be transferred by the conveyor COV to the second unit 200 where a subsequent process is performed.

The second unit 200 may form a sacrificial layer SCL on the support substrate 10. In an embodiment, the second unit 200 may form the sacrificial layer SCL on the support substrate 10 using the first to third supply nozzles 210, 220, and 230 located at the lower end of the second unit 200.

The first supply nozzle 210 sprays the graphene oxide solution onto the support substrate 10 to form the graphene oxide layer on the support substrate 10. The third supply nozzle 230 sprays the DI water onto the graphene oxide layer of the support substrate 10 to clean the graphene oxide layer. The second supply nozzle 220 sprays gas onto the graphene oxide layer of the support substrate 10, which has been cleaned, at high speed to dry the graphene oxide layer, thus finally forming the sacrificial layer SCL on the support substrate 10. In an embodiment, the first supply nozzle 210, the third supply nozzle 230, and the second supply nozzle 220 may be interconnected in line in the second unit 200.

The support substrate 10 having the sacrificial layer SCL formed thereon may be transferred to the third unit 300 by the conveyor COV.

In an embodiment, when the sacrificial layer SCL has a structure in which a plurality of graphene oxide layers having different charges is stacked, the support substrate 10 that has completed an associated process in the second unit 200 may be transferred to the fourth unit 400 by the conveyor COV.

The fourth unit 400 forms the second graphene oxide layer having opposite characteristics to the charge of the graphene oxide layer on the graphene oxide layer of the support substrate 10 transferred from the second unit 200 by the conveyor COV. In an embodiment, the fourth unit 400 may include first to third supply nozzles 410 to 430 located at the lower end of the fourth unit 400.

In the fourth unit 400, the first supply nozzle 410, the third supply nozzle 430, and the second supply nozzle 420 may be interconnected in line in the fourth unit 400.

Figure 9:
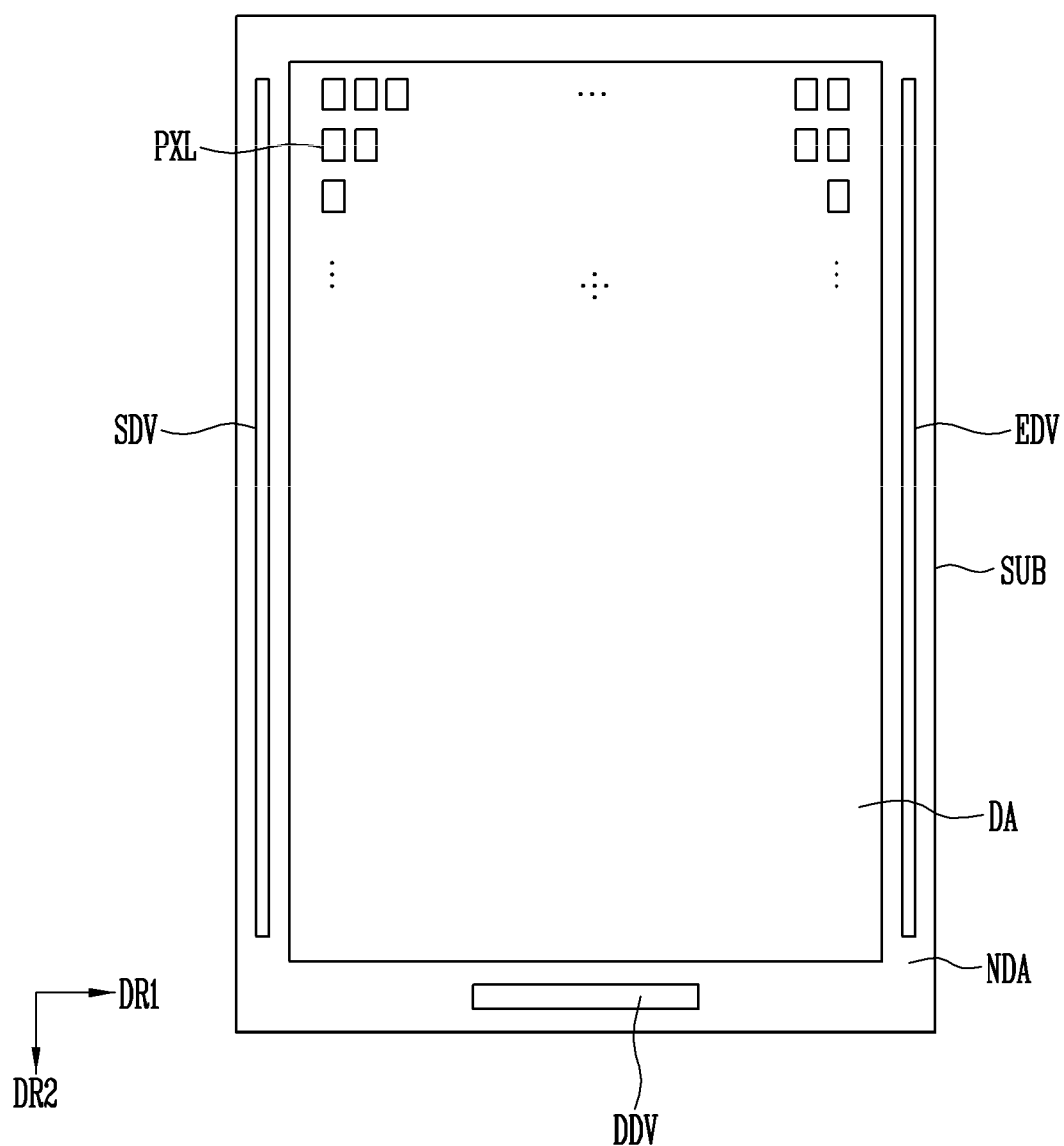
FIG. 9 is a schematic plan view illustrating a finally finished display device using the apparatus for manufacturing the display device shown in FIG. 1.

FIG. 9 is a schematic plan view illustrating a finally finished display device using the apparatus for manufacturing the display device shown in FIG. 1.

Referring to FIG. 9, the display device in accordance with the embodiment of the present disclosure includes a flexible substrate SUB, pixels PXL which are provided on the flexible substrate SUB, a drive unit which is provided on the flexible substrate SUB and configured to drive the pixels PXL, and a line unit (not shown) which couples the pixels PXL with the drive unit.

The flexible substrate SUB may have flexibility on at least a portion thereof, and may be folded on the portion having the flexibility. In an embodiment of the present disclosure, the term "fold" refers to the fact that the substrate may be changed from the original shape thereof to another shape without being fixed in shape, and has meanings including, being "folded" or "curved" along at least one specific line, e.g., a folding line, or "rolled" in a scroll manner.

The flexible substrate SUB may include a display area DA and a non-display area NDA. The display area DA may be an area in which the pixels PXL for displaying an image are provided. Each pixel PXL will be described later herein. The non-display area NDA may be an area in which the drive unit for driving the pixels PXL and a part of the line unit (not shown) for coupling the pixels PXL with the drive unit are provided.

The non-display area NDA may be provided on at least one side of the display area DA. In an embodiment of the present disclosure, the non-display area NDA may surround the periphery of the display area DA.

The pixels PXL may be provided in the display area DA on the flexible substrate SUB and may come into contact with a line. Each pixel PXL refers to a smallest unit for displaying the image, and a plurality of pixels may be provided.

The pixels PXL may include a light emitting element (not shown) for emitting white light and/or color light, and a pixel circuit (not shown) for driving the light emitting element. The pixel circuit may include at least one transistor that is coupled to the light emitting element.

Each pixel PXL may emit light having any color among red, green, and blue, but is not limited thereto. For example, each pixel PXL may emit light having any color among cyan, magenta, yellow, and white.

The plurality of pixels PXL may be arranged along rows extending in a first direction DR1 and columns extending in a second direction DR2 that intersects with the first direction DR1. In an embodiment of the present disclosure, the arrangement of the pixels PXL is not limited to a particular arrangement. In other words, the pixels PXL may be arranged in any of various forms.

The drive unit may provide a signal to each pixel PXL through the line unit and thus control the operation of each pixel PXL. In FIG. 9, the line unit is omitted for the convenience of description. The line unit will be described later herein.

The drive unit may include a scan driver SDV configured to apply a scan signal to each pixel PXL through a scan line, an emission driver EDV configured to apply an emission control signal to the pixel PXL through an emission control line, a data driver DDV configured to apply a data signal to the pixel PXL through a data line, and a timing controller (not shown). The timing controller may control the scan driver SDV, the emission driver EDV, and the data driver DDV.

In an embodiment of the present disclosure, the scan driver SDV, the emission driver EDV, and the data driver DDV may be disposed in the non-display area NDA of the flexible substrate SUB. The positions of the scan driver SDV, the emission driver EDV, and/or the data driver DDV may be changed as necessary.

Figure 10:
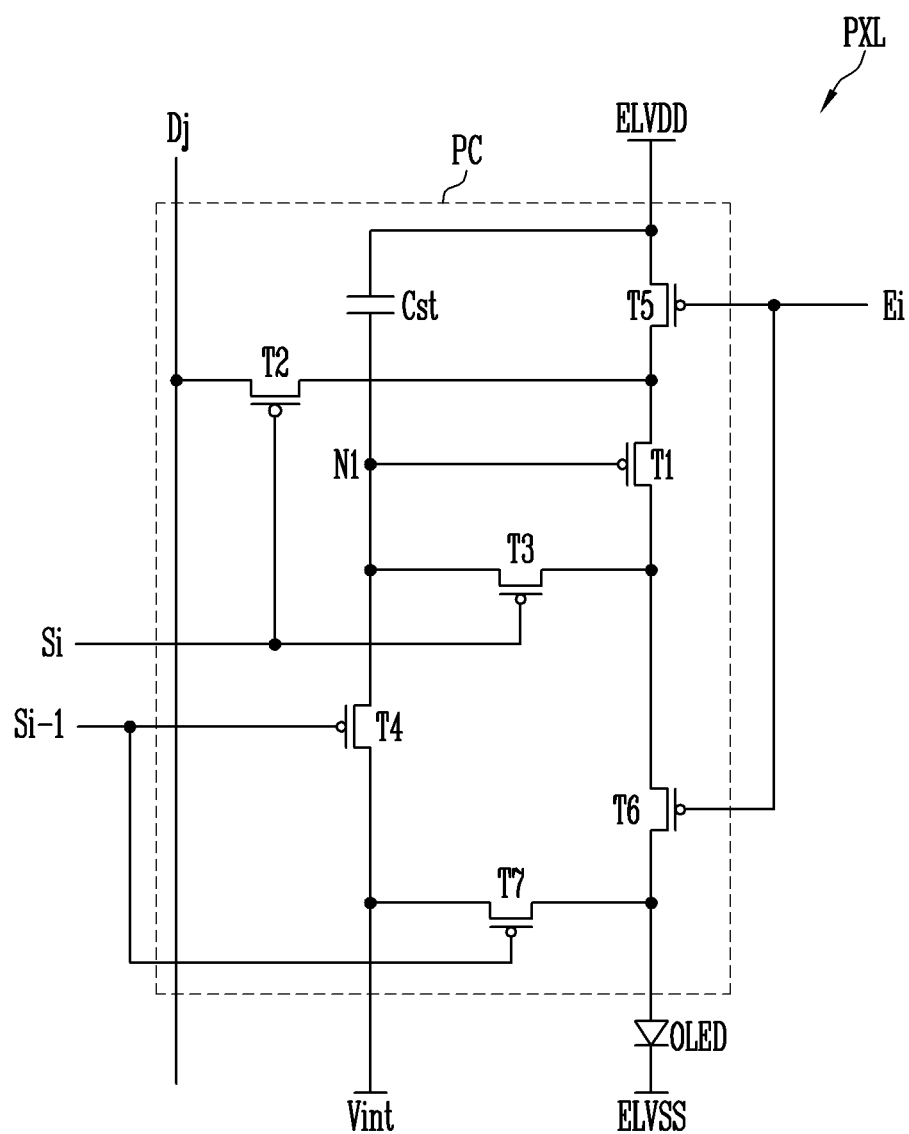
FIG. 10 is an equivalent circuit diagram illustrating one of pixels shown in FIG. 9.

FIG. 10 is an equivalent circuit diagram illustrating one of pixels shown in FIG. 9.

For the convenience of description, FIG. 10 illustrates one pixel coupled to a j-th data line Dj, an i−1-th scan line Si−1, and an i-th scan line Si.

Referring to FIG. 10, the pixel PXL in accordance with an embodiment of the present disclosure may include a light emitting element OLED, and a pixel circuit PC coupled to the light emitting element OLED and configured to drive the light emitting element OLED. In an embodiment, the pixel circuit PC may include first to seventh transistors T1 to T7, and a storage capacitor Cst.

An anode electrode of the light emitting element OLED may be coupled to the first transistor T1 via the sixth transistor T6. A cathode electrode of the light emitting element OLED may be coupled to a second driving power supply ELVSS. The light emitting element OLED may emit light having a predetermined luminance corresponding to current supplied from the first transistor T1. The voltage of a first driving power supply ELVDD to be applied to a power line may be set to a voltage higher than that of the second driving power supply ELVSS to allow current to flow to the light emitting element OLED. A potential difference between the first driving power supply ELVDD and the second driving power supply ELVSS may be set to be equal to or higher than a threshold voltage of the light emitting element OLED for the light emitting period of the pixel PXL.

An electrode of the first transistor T1 (driving transistor), for example, a source electrode may be coupled to the power line to which the first driving power supply ELVDD is applied via the fifth transistor T5, and another electrode, for example, a drain electrode may be coupled to the anode electrode of the light emitting element OLED via the sixth transistor T6. A gate electrode of the first transistor T1 may be coupled to a first node N1. Such a first transistor T1 controls, in response to the voltage of the first node N1, current flowing from the first driving power supply ELVDD to the second driving power supply ELVSS via the light emitting element OLED.

The second transistor T2 (switching transistor) is coupled between the j-th data line Dj coupled to the pixel PXL and the source electrode of the first transistor T1. A gate electrode of the second transistor T2 is coupled to the i-th scan line Si coupled to the pixel PXL. When the scan signal of the gate-on voltage (i.e. low voltage) is supplied from the i-th scan line Si, the second transistor T2 is turned on to electrically connect the j-th data line DLj to the source electrode of the first transistor T1. Hence, if the second transistor T2 is turned on, a data signal supplied from the j-th data line DLj is transmitted to the first transistor T1.

The third transistor T3 is coupled between the drain electrode of the first transistor T1 and the first node N1. A gate electrode of the third transistor T3 is coupled to the i-th scan line Si. When the scan signal of the gate-on voltage is supplied to the i-th scan line Si, the third transistor T3 is turned on to electrically connect the drain electrode of the first transistor T1 to the first node N1. Therefore, when the third transistor T3 is turned on, the first transistor T1 may be connected in the form of a diode.

The fourth transistor T4 is coupled between the first node N1 and a line to which an initialization power supply Vint is applied. A gate electrode of the fourth transistor T4 is coupled to a preceding scan line, e.g., an i−1-th scan line Si−1. When the scan signal of the gate-on voltage is supplied to the i−1-th scan line Si−1, the fourth transistor T4 is turned on to transmit the initialization power supply Vint to the first node N1. Here, the initialization power supply Vint may have a voltage that is a minimum voltage of the data signal or less.

The fifth transistor T5 is coupled between the first driving power supply ELVDD and the first transistor T1. A gate electrode of the fifth transistor T5 is coupled to a corresponding emission control line, e.g., an i-th emission control line Ei. The fifth transistor T5 is turned off when an emission control signal having a gate-off voltage is supplied to the i-th emission control line Ei, and is turned on in other cases.

The sixth transistor T6 is coupled between the first transistor T1 and the anode electrode of the light emitting element OLED. A gate electrode of the sixth transistor T6 is coupled to the i-th emission control line Ei. The sixth transistor T6 is turned off when an emission control signal having a gate-off voltage is supplied to the i-th emission control line Ei, and is turned on in other cases.

The seventh transistor T7 is coupled between the anode electrode of the light emitting element OLED and a line to which an initialization power supply Vint is applied. A gate electrode of the seventh transistor T7 is coupled to any one of preceding scan lines, e.g., an i−1-th scan line Si−1. When the scan signal of the gate-on voltage is supplied to the i−1-th scan line Si−1, the seventh transistor T7 is turned on to supply the initialization power supply Vint to the anode electrode of the light emitting element OLED.

The storage capacitor Cst is coupled between the first driving power supply ELVDD and the first node N1. The storage capacitor Cst stores a voltage corresponding both to the data signal applied to the first node N1 during each frame period and to the threshold voltage of the first transistor T1.

Figure 11:
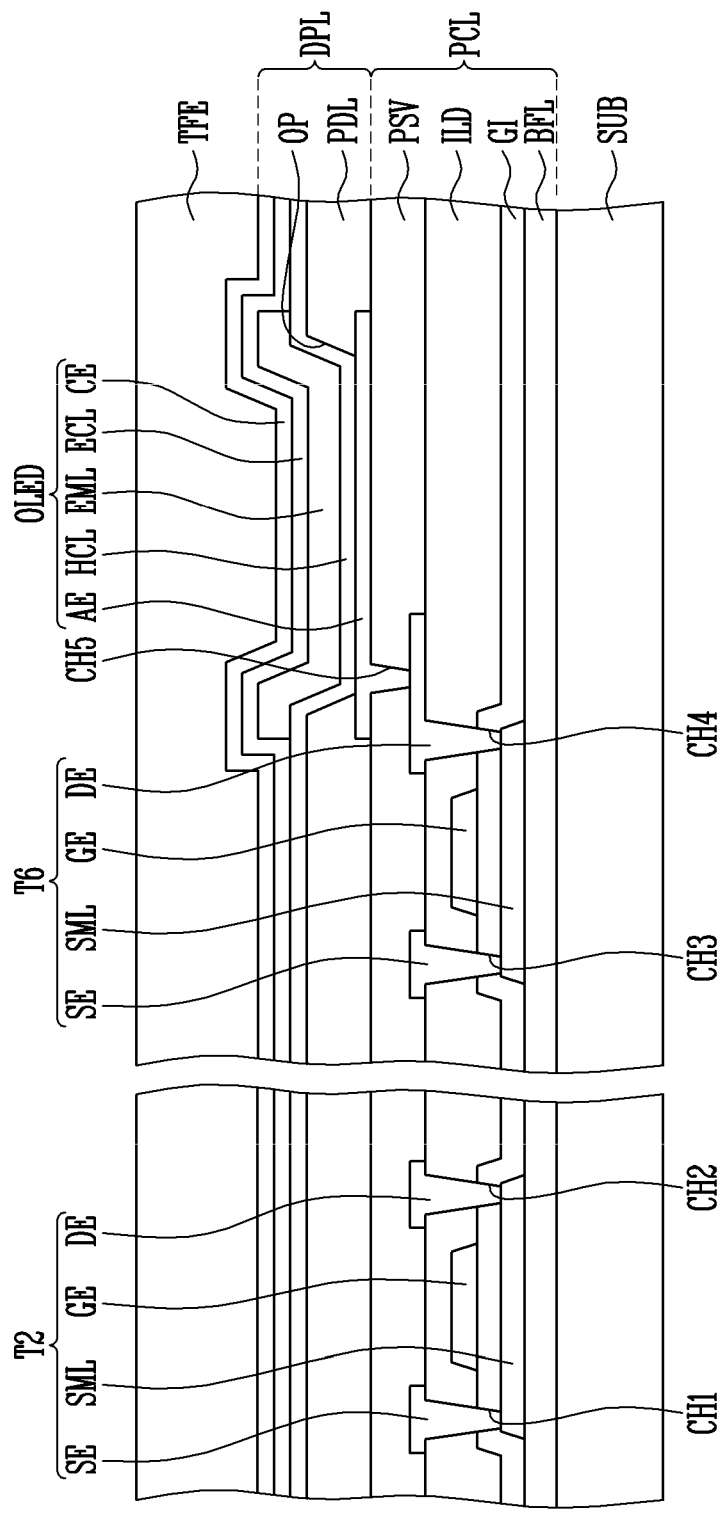
FIG. 11 is an enlarged cross-sectional view illustrating the display device of FIG. 9.

FIG. 11 is an enlarged cross-sectional view illustrating the display device of FIG. 9.

For the convenience of description, FIG. 11 illustrates a cross-section of portions corresponding to only the second and sixth transistors of the first to seventh transistors illustrated in FIG. 10.

Referring to FIGS. 9 to 11, the display device may include a flexible substrate SUB, a pixel circuit layer PCL, a display element layer DPL, and a thin-film encapsulation film TFE.

The flexible substrate SUB may be made of material having flexibility so as to be bendable or foldable, and have a single- or multi-layer structure. For example, the flexible substrate SUB may include at least one of the following: polystyrene, polyvinyl alcohol, polymethyl methacrylate, polyether sulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL may include a buffer layer BFL, first to seventh transistors T1 to T7, and a passivation layer PSV.

The buffer layer BFL may be provided on the flexible substrate SUB and prevent or substantially prevent impurities from diffusing into the first to seventh transistors T1 to T7. The buffer layer BF may be provided in a single-layer structure or a multi-layer structure having at least two or more layers. The buffer layer BFL may be omitted depending on the material of the flexible substrate SUB or processing conditions.

Each of the first to seventh transistors T1 to T7 may include a semiconductor layer, a gate electrode, a source electrode, and a drain electrode. In an embodiment, as illustrated in FIG. 11, each of the second and sixth transistors T2 and T6 may include a semiconductor layer SML, a gate electrode GE, a source electrode SE, and a drain electrode DE.

The semiconductor layer SML of each of the second and sixth transistors T2 and T6 may be provided on the buffer layer BFL. The semiconductor layer SML may include a first area which comes into contact with the source electrode SE and a second area which comes into contact with the drain electrode DE. An area between the first area and the second area may be a channel area. In an embodiment of the present disclosure, the first area may be any one of a source area and a drain area, and the second area may be the other of a source area and a drain area.

The semiconductor layer SML may be a semiconductor pattern formed of polysilicon, amorphous silicon, an oxide semiconductor, etc. The channel area may be an intrinsic semiconductor pattern undoped with impurities. In some embodiments, the channel area may be doped with impurities. Impurities such as n-type impurities, p-type impurities, or other metals may be used as the impurities. Each of the first and second areas may be a semiconductor pattern doped with impurities.

The gate electrode GE of each of the second and sixth transistors T2 and T6 may be provided on the corresponding semiconductor layer SML with a gate insulating layer GI interposed therebetween.

The source electrode SE of each of the second and sixth transistors T2 and T6 may make contact with any one of the first area and the second area of the corresponding semiconductor layer SML through a contact hole sequentially passing through an interlayer insulating layer ILD and the gate insulating layer GI. For example, the source electrode SE of the second transistor T2 may make contact with the first area of the corresponding semiconductor layer SML through a first contact hole CH1 passing through the interlayer insulating layer ILD and the gate insulating layer GI. The source electrode SE of the sixth transistor T6 may make contact with the first area of the corresponding semiconductor SML through a third contact hole CH3 passing through the interlayer insulating layer ILD and the gate insulating layer GI.

The drain electrode DE of each of the second and sixth transistors T2 and T6 may make contact with the other one of the first area and the second area of the corresponding semiconductor layer SML through a contact hole passing through the interlayer insulating layer ILD and the gate insulating layer GI. For example, the drain electrode DE of the second transistor T2 may make contact with the second area of the corresponding semiconductor layer SML through a second contact hole CH2 passing through the interlayer insulating layer ILD and the gate insulating layer GI. The drain electrode DE of the sixth transistor T6 may make contact with the second area of the corresponding semiconductor SML through a fourth contact hole CH4 passing through the interlayer insulating layer ILD and the gate insulating layer GI.

In an embodiment of the present disclosure, each of the interlayer insulating layer ILD and the gate insulating layer GI may be formed of an inorganic insulating layer including an inorganic material, or an organic insulating layer including an organic material.

The passivation layer PSV may be provided on the second and sixth transistors T2 and T6 to cover the second and sixth transistors T2 and T6. The passivation layer PSV may include a fifth contact hole CH5 through which a portion of the drain electrode DE of the sixth transistor T6 is exposed to the outside.

The display element layer DPL may include a light emitting element OLED provided on the passivation layer PSV and configured to emit light.

The light emitting element OLED may include first and second electrodes AE and CE, and an emission layer EML provided between the two electrodes AE and CE. Any one of the first and second electrodes AE and CE may be an anode electrode, and the other one may be a cathode electrode. For example, the first electrode AE may be an anode electrode, while the second electrode CE may be a cathode electrode. In a case in which the light emitting element OLED is a top-emission type organic light emitting element, the first electrode AE may be a reflective electrode, and the second electrode CE may be a transmissive electrode. In the present embodiment, there is illustrated the case in which the light emitting element OLED is a top-emission type organic light-emitting diode and the first electrode AE is an anode electrode.

The first electrode AE may be electrically coupled to the drain electrode DE of the sixth transistor T6 through the fifth contact hole CH5 passing through the passivation layer PSV. The first electrode AE may include a reflective layer (not illustrated) which may reflect light, and a transparent conductive layer (not illustrated) which is disposed on or under the reflective layer. At least one of the transparent conductive layer and the reflective layer may be electrically coupled to the drain electrode DE of the sixth transistor T6.

The display element layer DPL may further include a pixel defining layer PDL having an opening OP which exposes a portion of the first electrode AE, e.g., an upper surface of the first electrode AE.

Each of the pixels PXL provided on the display panel may be disposed in a pixel area on a planar surface of the display panel. In an embodiment of the present disclosure, the pixel area may include an emission area and a non-emission area provided adjacent to the emission area. In an embodiment, the non-emission area may enclose the emission area. In this embodiment, the emission area may be defined to correspond to the portion of the first electrode AE that is exposed through the opening OP.

The display element layer DPL may include a hole control layer HCL and an electron control layer ECL.

The hole control layer HCL may be disposed in common in the emission area and the non-emission area. Although not illustrated, a common layer such as the hole control layer HCL may be formed in common in the plurality of pixels PXL.

The emission layer EML may be disposed on the hole control layer HCL. The emission layer EML may be disposed in an area corresponding to the opening OP. In other words, in an embodiment, the emission layer EML may be separately provided in each of the plurality of pixels PXL. The emission layer EML may include organic material and/or inorganic material. In an embodiment of the present disclosure, although the patterned emission layer EML has been illustrated, the emission layer EML may be provided in common for the pixels PXL. The color of light generated from the emission layer EML may be one of red, green, blue, and white, but the present disclosure is not limited thereto. For example, the color of light generated from the emission layer EML may be one of magenta, cyan, and yellow.

The electron control layer ECL may be provided on the emission layer EML. The electron control layer ECL may be provided in common for the pixels PXL and function to inject and/or transport electrons to the emission layer EML.

The second electrode CE may be provided on the electron control layer ECL. The second electrode CE may be provided in common for the pixels PXL.

The thin-film encapsulation film TFE may be provided on the second electrode CE to cover the second electrode CE.

The thin-film encapsulation film TFE may be formed of a single layer, or multi-layers. The thin-film encapsulation film TFE may include a plurality of insulating layers configured to cover the light emitting element OLED. In an embodiment, the thin-film encapsulation film TFE may include at least one inorganic layer and at least one organic layer. For example, the thin-film encapsulation film TFE may have a structure formed by alternately stacking the inorganic layers and the organic layers. In some embodiments, the thin-film encapsulation film TFE may be an encapsulation substrate which is disposed on the light emitting element OLED and joined to the flexible substrate SUB through a sealant.

Figure 12:
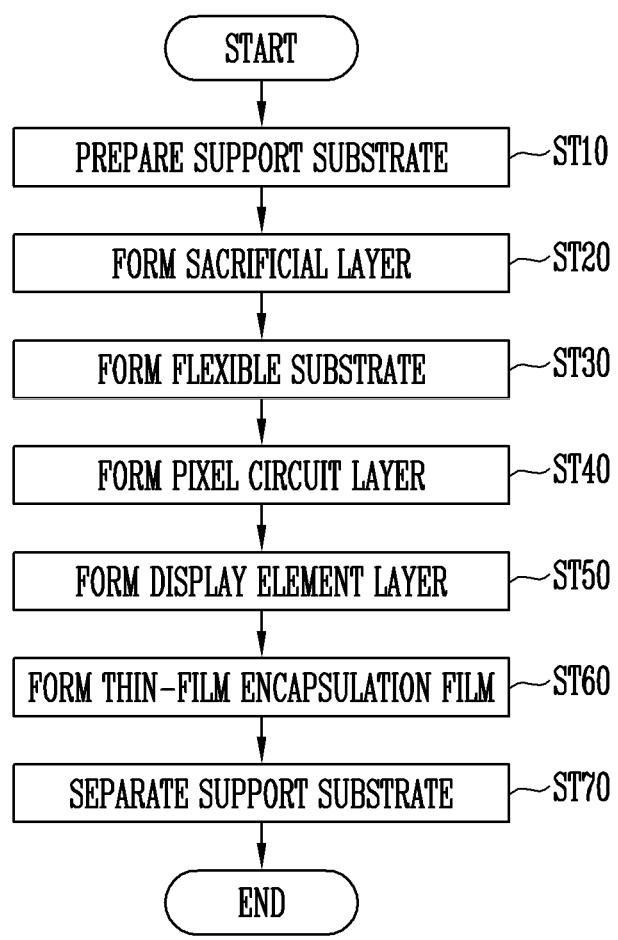
FIG. 12 is a flowchart illustrating a method of manufacturing the display device of FIG. 9.

FIG. 12 is a flowchart illustrating a method of manufacturing the display device of FIG. 9; and FIGS. 13A to 13G are cross-sectional views sequentially illustrating the method of manufacturing the display device of FIG. 9 according to the flowchart of FIG. 12.

Herein, a method of manufacturing the display device in accordance with an embodiment of the present disclosure will be described with reference to embodiments of FIGS. 1 to 11, and FIGS. 12 and 13A to 13G.

Figure 13A:

Referring to FIGS. 1, 12, and 13A, the support substrate 10 is prepared (ST10).

The support substrate 10 may be transferred to the first unit 100 by the conveyor COV to remove surface impurities. In an embodiment of the present disclosure, the support substrate 10 may be a substrate that supports the flexible substrate SUB to form the flexible display device. Examples of the support substrate may include a glass substrate, a polymer film, or a silicon wafer, but the present disclosure is not limited thereto. In some embodiments, the support substrate 10 may be of any type including a material which may be easily peeled (or separated) from the flexible substrate SUB by the sacrificial layer SCL while sufficiently supporting the flexible substrate SUB.

Figure 13B:
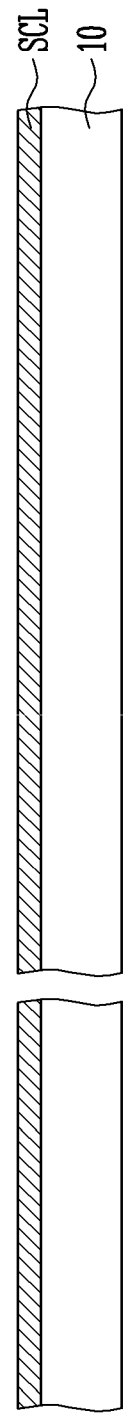

Referring to FIGS. 1, 12 and 13B, the sacrificial layer SCL is formed on the support substrate 10 (ST20).

The graphene oxide solution may be sprayed onto the support substrate 10 transferred from the first unit 100 to the second unit 200 by the conveyor COV to form the graphene oxide layer, and the graphene oxide layer may be cleaned and then dried, thus finally forming the sacrificial layer SCL on the surface of the support substrate 10.

In an embodiment, the graphene oxide solution is bonded to the support substrate 10 by van der Waals bonding, and is sprayed onto the support substrate 10 through a spray coating method from the first supply nozzle 210 of the second unit 200, thus forming the graphene oxide layer.

The support substrate 10 including the sacrificial layer SCL may be transferred to the third unit 300 by the conveyor COV.

Figure 13C:
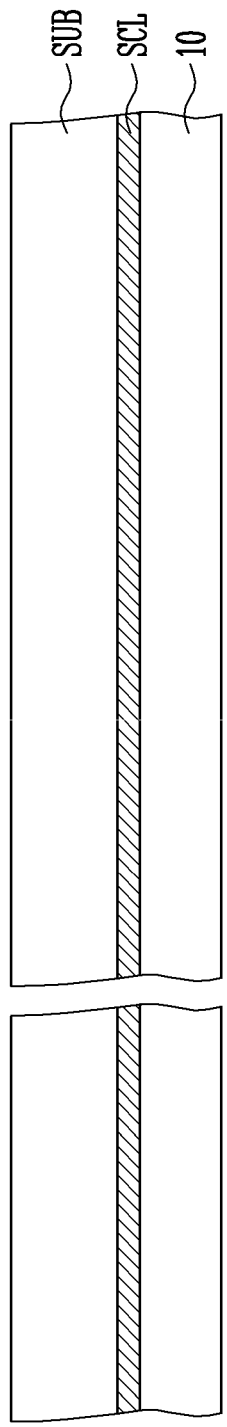

Referring to FIGS. 1, 12 and 13C, the flexible substrate SUB is formed on the sacrificial layer SCL (ST30).

An insulating material having flexibility is applied to the sacrificial layer SCL on the support substrate 10 transferred from the third unit 300 to the flexible substrate forming unit 500 by the conveyor COV, thus forming the flexible substrate SUB.

The support substrate 10 including the flexible substrate SUB may be transferred to the pixel circuit layer forming unit 600 by the conveyor COV.

Referring to FIGS. 1, 12 and 13D, the pixel circuit layer PCL is formed on the flexible substrate SUB (ST40).

The pixel circuit layer PCL may include a buffer layer BFL formed on the flexible substrate SUB, at least one transistor T2 and T6 formed on the buffer layer, and a passivation layer PSV configured to cover the transistor T2 and T6.

The support substrate 10 including the pixel circuit layer PCL may be transferred to the display element layer forming unit 700 by the conveyor COV.

Figure 13E:
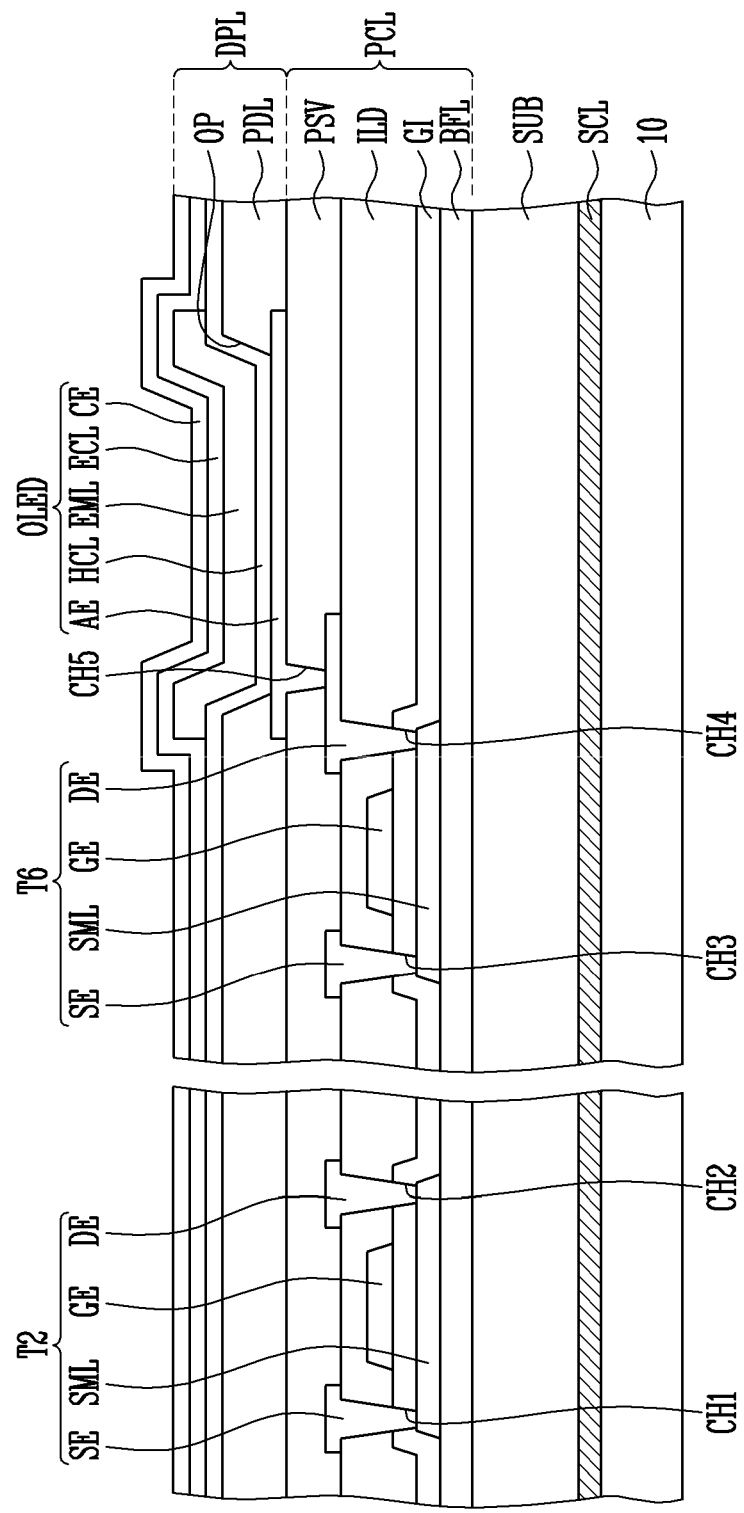
Figure 13F:
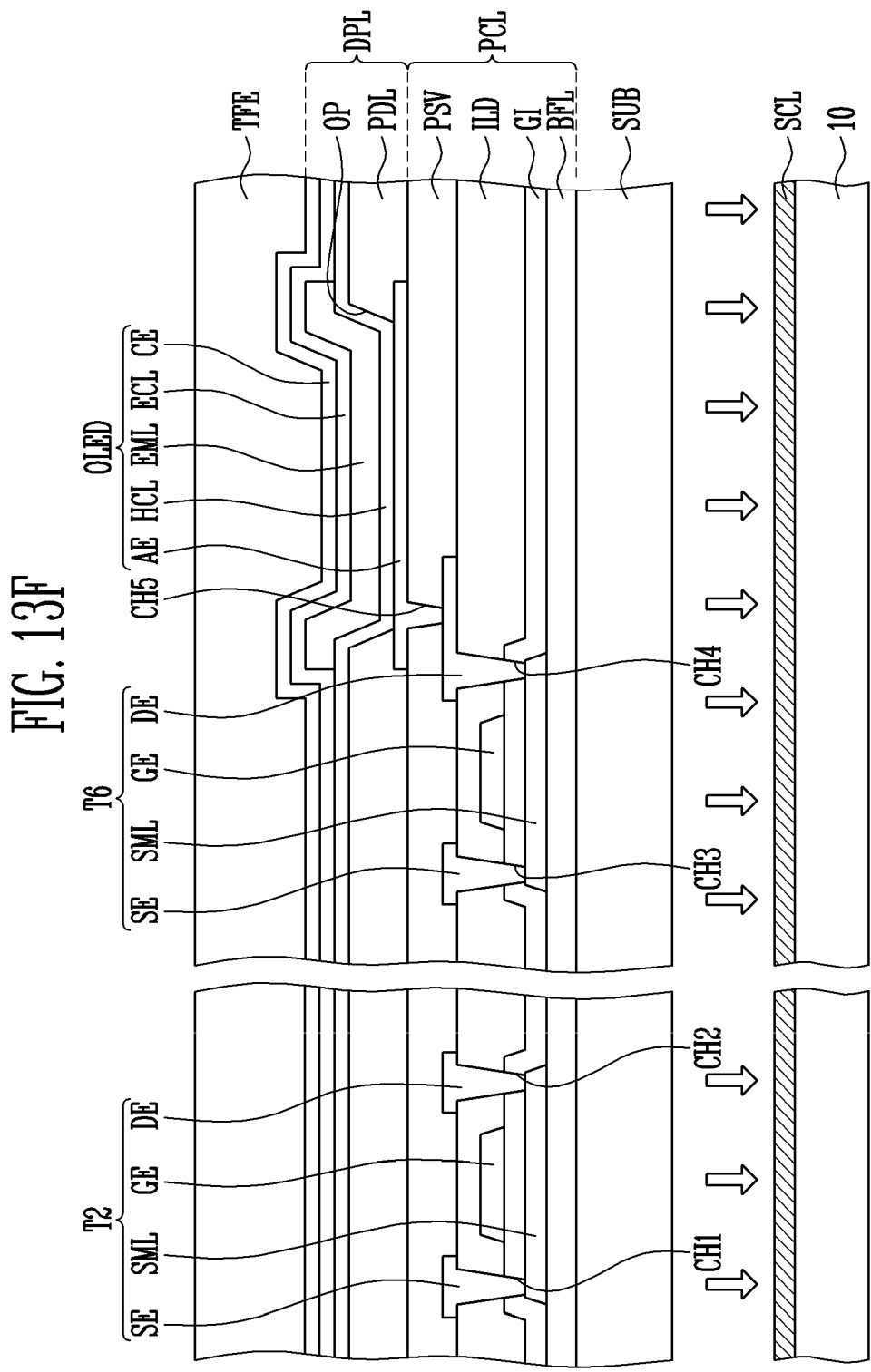
Figure 13G:
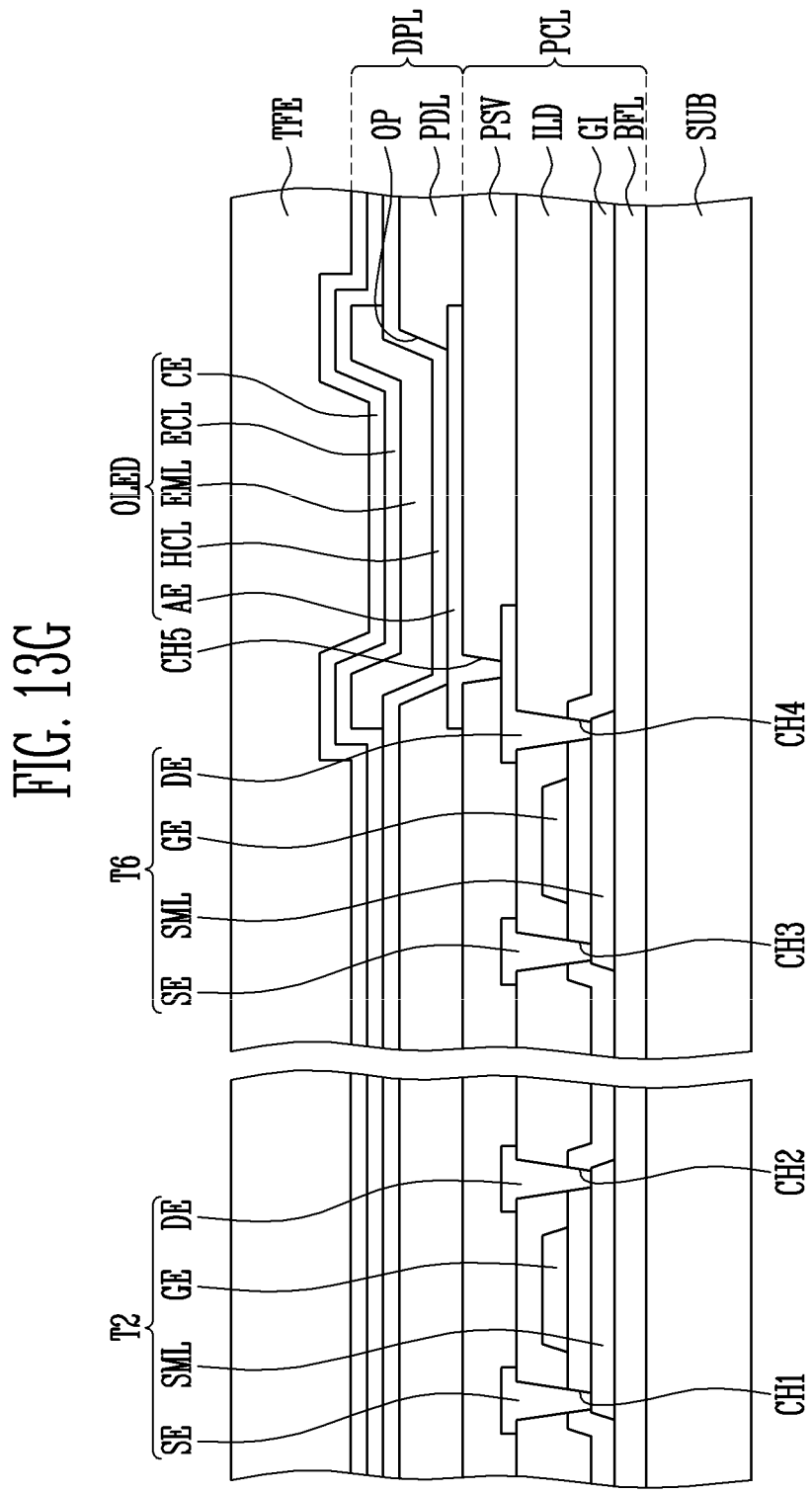

Referring to FIGS. 1, 12 and 13E, the display element layer DPL is formed on the pixel circuit layer PCL (ST50).

The display element layer DPL may include a light emitting element OLED configured to emit light, and a pixel defining layer PDL configured to delimit an emission area of the light emitting element OLED. The light emitting element OLED may include a first electrode AE formed on the pixel circuit layer PCL, a light-emitting layer EML formed on the first electrode AE, and a second electrode CE formed on the light-emitting layer EML.

The support substrate 10 including the display element layer DPL may be transferred to the thin-film encapsulation film forming unit 800 by the conveyor COV.

Referring to FIGS. 1, 12, 13F, and 13G, the thin-film encapsulation film TFE is formed on the display element layer DPL (ST60).

The thin-film encapsulation film TFE may include a plurality of insulating layers configured to cover the light emitting element OLED. In an embodiment, the thin-film encapsulation film TFE may include at least one inorganic layer and at least one organic layer. For example, the thin-film encapsulation film TFE may have a structure formed by alternately stacking the inorganic layers and the organic layers.

Subsequently, the support substrate 10 including the thin-film encapsulation film TFE may be transferred to the cutting unit 900 by the conveyor COV and then cut into a cell unit to be separated into a plurality of display devices.

Next, the support substrate 10 is separated from the flexible substrate SUB of each display device that is cut into the cell unit (ST70).

Various methods may be utilized as the method for separating the support substrate 10. For example, any of the following methods may be applied: a method of separating the support substrate 10 from the flexible substrate SUB through a physical method using equipment, a method of separating the support substrate 10 from the flexible substrate SUB using a chemical method, or a method of separating the support substrate 10 from the flexible substrate SUB by directly radiating a laser onto the sacrificial layer SCL.

Embodiments of the present disclosure provide an apparatus and a method for manufacturing a display device, which forms a sacrificial layer on a support substrate using a coating nozzle, a rinse nozzle, and a drying nozzle that are connected in line, thus simplifying a manufacturing process and improving the yield of the manufacturing process.

Further, embodiments of the present disclosure provide an apparatus and a method for manufacturing a display device, which separates a support substrate from a flexible substrate using a sacrificial layer, thus minimizing or reducing defects occurring in the flexible substrate.

However, aspects and effects of the present disclosure are not limited by the foregoing, and other various aspects and effects are anticipated by or will be apparent from the present disclosure.

While various example embodiments have been described above, those skilled in the art will appreciate that various modifications, additions, and substitutions are possible, without departing from the scope and spirit of the present disclosure.

Therefore, the embodiments disclosed in this specification are for illustrative purposes rather than limiting the technical spirit of the present disclosure. The scope of the present disclosure is set forth by the accompanying claims.

What is claimed is:

1. An apparatus for manufacturing a display device, comprising:
   a first unit configured to remove impurities of a support substrate;
   a second unit configured to form a sacrificial layer on the support substrate;
   a third unit configured to form a flexible substrate on the sacrificial layer; and
   a fourth unit configured to form a display unit on the flexible substrate,
   wherein the second unit comprises:
      a moving unit movable in a first direction to receive the support substrate;
      a first supply nozzle configured to spray a solution, to be bonded to the support substrate by van der Waals bonding, onto the support substrate to coat a graphene oxide layer; and
      a second supply nozzle configured to dry the graphene oxide layer coated on the support substrate while removing a portion of the graphene oxide layer, to form the sacrificial layer,
      wherein the first supply nozzle and the second supply nozzle are spaced apart from each other by a distance and are coupled to each other in line, and
      wherein each of the first and second supply nozzles comprises an injection port having an injection angle of about 15° to 45°.

2. The apparatus according to claim 1, wherein the distance between the first supply nozzle and the second supply nozzle is about 50 mm.

3. The apparatus according to claim 1, wherein the second unit further comprises a third supply nozzle between the first supply nozzle and the second supply nozzle.

4. The apparatus according to claim 3, wherein the third supply nozzle is configured to spray deionized water onto the graphene oxide layer of the support substrate moving in the first direction to clean the graphene oxide layer of the support substrate.

5. The apparatus according to claim 4, wherein the third supply nozzle is spaced apart from each of the first and second supply nozzles by a distance and is coupled to the first and second supply nozzles in line.

6. The apparatus according to claim 5, wherein the third supply nozzle comprises an injection port having an injection angle of about 15° to 45°.

7. The apparatus according to claim 5, wherein a distance between the first supply nozzle and the third supply nozzle is equal to a distance between the third supply nozzle and the second supply nozzle.

8. The apparatus according to claim 7, wherein the second supply nozzle comprises an air knife to spray gas at high pressure.

9. The apparatus according to claim 7, wherein each of the first to third supply nozzles comprises at least one subsidiary supply nozzle arranged in the first direction.

10. The apparatus according to claim 9,
wherein the subsidiary supply nozzle of each of the first to third supply nozzles comprises an injection port, and
wherein the injection port is repeatedly movable leftwards and rightwards from the first direction to a direction opposite to the first direction.

11. The apparatus according to claim 9,
wherein the second unit further comprises a frame to support each of the first to third supply nozzles, and
wherein the frame is movable in the first direction.

12. The apparatus according to claim 9, wherein the second unit further comprises a recovery unit to recover the solution sprayed from the first supply nozzle.

13. The apparatus according to claim 1, wherein the display unit comprises:
a pixel circuit layer on the flexible substrate and comprising at least one transistor; and
a display element layer on the pixel circuit layer and electrically coupled to the transistor to emit light.

14. A method of manufacturing a display device, comprising:
preparing a support substrate;
forming a sacrificial layer by spraying a solution, which is bonded to the support substrate by van der Waals bonding, onto the support substrate, thus coating a graphene oxide layer, and then drying the graphene oxide layer while removing a portion of the graphene oxide layer;
forming a flexible substrate on the sacrificial layer;
forming a display unit on the flexible substrate;
forming a thin-film encapsulation film on the display unit; and
separating the support substrate from the flexible substrate.

15. The method according to claim 14, wherein the forming of the sacrificial layer further comprises cleaning the graphene oxide layer by spraying deionized water onto the graphene oxide layer of the support substrate moving in a first direction.

16. The method according to claim 15, wherein the forming of the sacrificial layer comprises drying the graphene oxide layer while removing a portion of the graphene oxide layer using an air knife configured to spray gas at high pressure.

17. The method according to claim 16, wherein the preparing of the support substrate comprises removing surface impurities of the support substrate.

18. The method according to claim 17, wherein the surface impurities of the support substrate are removed by spraying oxygen plasma onto a surface of the support substrate.

19. The method according to claim 14, wherein the forming of the display unit comprises:
forming a pixel circuit layer comprising at least one transistor on the flexible substrate; and
forming a display element layer comprising a light emitting element on the pixel circuit layer, the light emitting element being electrically coupled to the transistor to emit light.

20. An apparatus for manufacturing a display device, comprising:
a first unit configured to remove impurities of a support substrate;
a second unit configured to form a sacrificial layer on the support substrate;
a third unit configured to form a flexible substrate on the sacrificial layer; and
a fourth unit configured to form a display unit on the flexible substrate,
wherein the second unit comprises:
a moving unit movable in a first direction to receive the support substrate;
a first supply nozzle configured to spray a solution, which is bondable to the support substrate by van der Waals bonding, onto the support substrate, to coat a graphene oxide layer; and
a second supply nozzle configured to dry the graphene oxide layer coated on the support substrate while removing a portion of the graphene oxide layer, to form the sacrificial layer,
wherein the first supply nozzle and the second supply nozzle are spaced apart from each other by a distance and are coupled to each other in line.

* * * * *